US010411919B2

(12) United States Patent
Sreeramaneni et al.

(10) Patent No.: US 10,411,919 B2
(45) Date of Patent: *Sep. 10, 2019

(54) ANALOG MULTIPLEXING SCHEME FOR DECISION FEEDBACK EQUALIZERS

(71) Applicant: Micron Technology, Inc., Boise, ID (US)

(72) Inventors: Raghukiran Sreeramaneni, McKinney, TX (US); Daniel B. Penney, Wylie, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/191,169

(22) Filed: Nov. 14, 2018

(65) Prior Publication Data

US 2019/0222445 A1 Jul. 18, 2019

Related U.S. Application Data

(63) Continuation of application No. 15/872,140, filed on Jan. 16, 2018, now Pat. No. 10,153,922.

(51) Int. Cl.
*H04L 25/03* (2006.01)
*G11C 7/10* (2006.01)
(Continued)

(52) U.S. Cl.
CPC .......... *H04L 25/03057* (2013.01); *G11C 7/02* (2013.01); *G11C 7/1006* (2013.01); *G11C 7/1063* (2013.01); *G11C 11/4096* (2013.01); *H04L 25/4917* (2013.01); *G11C 2207/107* (2013.01)

(58) Field of Classification Search
CPC .......... H04L 25/03057; H04L 25/4917; G11C 7/1063
See application file for complete search history.

(56) References Cited

U.S. PATENT DOCUMENTS 10,153,922 B1* 12/2018 Sreeramaneni ...... G11C 7/1006
2004/0264615 A1* 12/2004 Ho .................... H04L 25/03006
375/355

(Continued)

OTHER PUBLICATIONS

PCT International Search Report & Written Opinion for PCT Application No. PCT/US201/050518 dated Jan. 7, 2019; 13 Pages.

*Primary Examiner* — Kenneth T Lam
(74) *Attorney, Agent, or Firm* — Fletcher Yoder, P.C.

(57) ABSTRACT

A device includes a voltage generator that generates a reference signal, a multi-level bias generator coupled to the voltage generator to receive the reference signal and generate a plurality of bias level signals based at least in part on the reference signal. The multi-level bias generator transmits the plurality of bias level signals to a plurality of multiplexers that each receive a select signal to select a subset of bias level signals of the plurality of bias level signals based. The device also includes an adjustment circuit of a decision feedback equalizer that receives a respective selected subset of bias level signals from one multiplexer of the plurality of multiplexers and utilizes the respective selected subset of bias level signals to compensate for inter-symbol interference of a bit due to a previously received bit of a bit stream.

17 Claims, 16 Drawing Sheets

(51) Int. Cl.
*H04L 25/49* (2006.01)
*G11C 7/02* (2006.01)
*G11C 11/4096* (2006.01)

(56) References Cited

U.S. PATENT DOCUMENTS

| | | | |
|---|---|---|---|
| 2005/0135519 A1* | 6/2005 | Lee | H04L 25/03133 375/348 |
| 2006/0239341 A1 | 10/2006 | Marlett et al. | |
| 2009/0175328 A1* | 7/2009 | Kim | G11C 7/02 375/233 |
| 2011/0096825 A1 | 4/2011 | Hollis | |
| 2012/0155529 A1* | 6/2012 | Mangaser | H04L 25/03057 375/233 |
| 2012/0314756 A1 | 12/2012 | Leibowitz et al. | |
| 2013/0314756 A1* | 11/2013 | Amemiya | F21V 13/04 358/497 |
| 2015/0333938 A1 | 11/2015 | Kaviani et al. | |

* cited by examiner

ANALOG MULTIPLEXING SCHEME FOR DECISION FEEDBACK EQUALIZERS

CROSS-REFERENCE TO RELATED APPLICATIONS

The present application is a continuation of U.S. application Ser. No. 15/872,140, entitled "Analog Multiplexing Scheme for Decision Feedback Equalizers," and filed Jan. 16, 2018, the entirety of which is incorporated by reference herein for all purposes.

BACKGROUND

Field of the Invention

Embodiments of the present disclosure relate generally to the field of semiconductor memory devices. More specifically, embodiments of the present disclosure relate to a routing scheme to deliver a set of one or more bias levels to one or more decision feedback equalizer (DFE) circuits of a semiconductor memory device.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Additionally, correcting distortions in the transmitted signals continues to be important. However, conventional distortion correction techniques may not adequately correct the distortions of the signal. A DFE circuit may require the generation of certain input bias levels, yet conventional generation of these bias levels may be impacted by changes across processes, voltages and temperatures (PVT) and may not generate input bias levels with a high level of precision across a wide range of PVT conditions. Errors that result from bias levels generated with a lack of tolerance for PVT conditions can cause additional distortions to the final data, thus reducing the reliability of data transmitted within the memory devices. Further, a wide range of channel conditions may require the generation and programming of a wide range of input bias levels. That is, a memory device may contain multiple channels that may each suffer from their own channel distortion conditions. Accordingly, each channel may receive a different bias level, and as the number of channels increases, the resources and time involved with routing each bias level to a respective channel may increase.

BRIEF DESCRIPTION OF THE DRAWINGS

Various aspects of this disclosure may better be understood upon reading the following detailed description and upon reference to the drawings in which.

DETAILED DESCRIPTION

Figure 1:
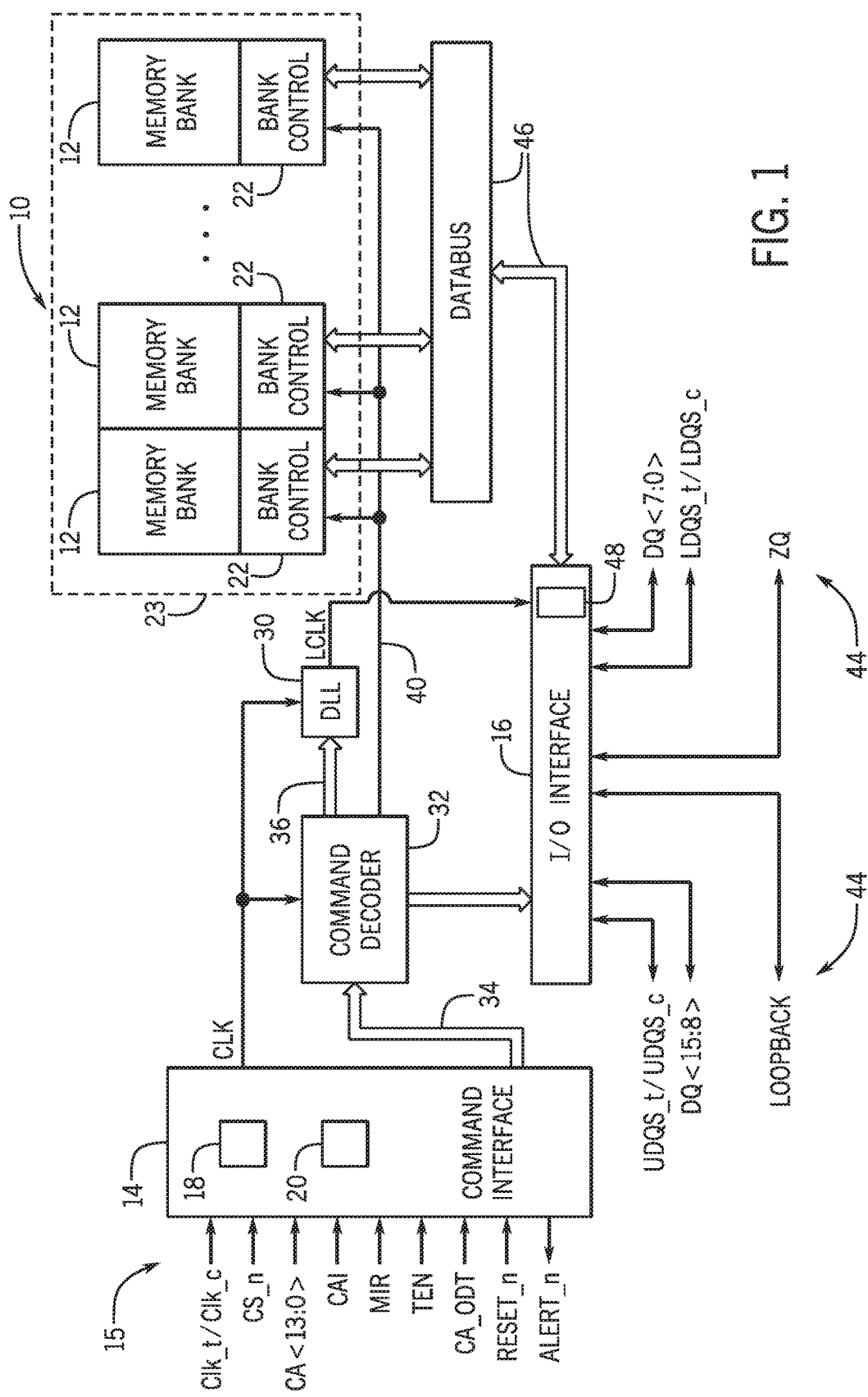
FIG. 1 is a simplified block diagram illustrating certain features of a memory device, according to an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Using a decision feedback equalizer (DFE) of a memory device to perform distortion correction techniques may be valuable for example, to correctly compensate for distortions in the received data of the memory device. This insures that accurate values are being stored in the memory of the memory device. The DFE may use previous bit data to create corrective values to compensate for distortion resulted from the previous bit data. For example, the most recent previous bit may have more of a distortion effect on the current bit than a bit transmitted several data points before, causing the corrective values to be different between the two bits. With these levels to correct for, the DFE may operate to correct the distortion of the transmitted bit.

In some embodiments, the DFE may require the use of bias levels in order to precisely generate the distortion correction factors to sufficiently equalize a channel. As the bias levels may work to directly or indirectly remove distortion from data, increasing the reliability of the bias levels may increase the reliability that the distortion was removed from the data after it was processed by the DFE. Thus, increased precision in bias level generation may increase precision in channel equalization.

Generating precise bias levels across changes in processes, voltages, and temperatures (PVT) for a DFE circuit may be valuable to sufficiently equalize a channel in conjunction with changing operating conditions. Because a memory device may contain multiple data channels, which may each include different channel conditions, different bias levels may be generated to individually equalize each channel. As the number of different channels, the number of different bias levels, or a combination, thereof, increases, the resources and time to deliver the bias levels to a suitable region in the memory device may increase. As such, the memory device may include systems and methods to efficiently route the suitable bias levels to different channels and/or to different taps within the DFE circuit using an analog muxing scheme. Accordingly, as will be described below, the analog muxing scheme may receive a number of bias levels and may select, via a multiplexer, for example, a subset of the bias levels to deliver to a specific portion of the memory device and/or the DFE circuit.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/ and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
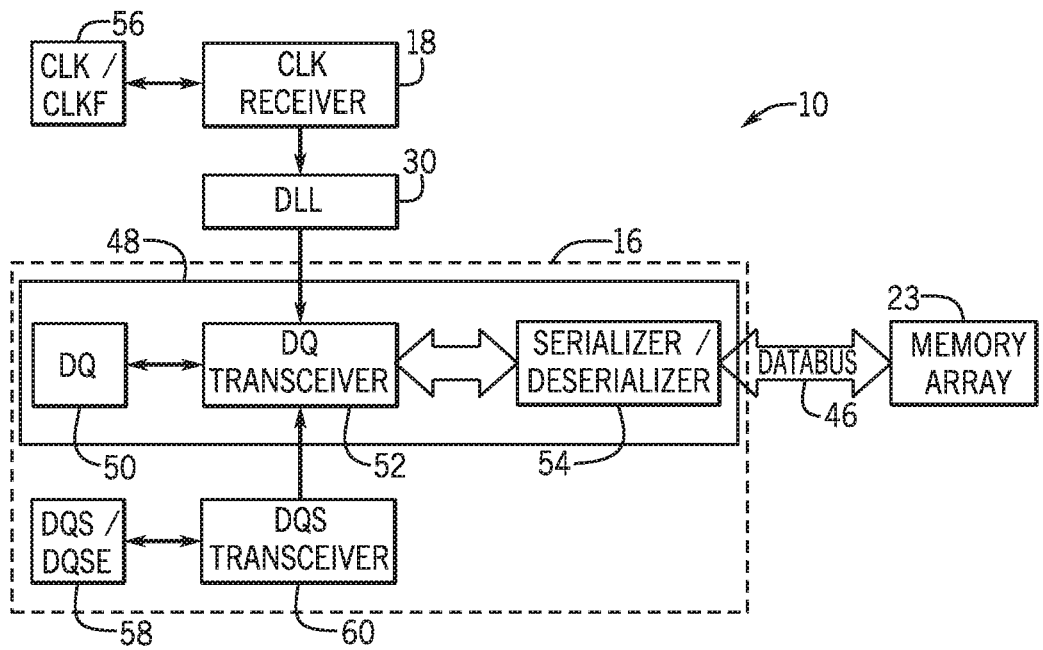
FIG. 2 illustrates a block diagram illustrating a data transceiver of the I/O interface of FIG. 1, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ connector 50, a DQ transceiver 52, and a serializer/deserializer 54. It should be noted that in some embodiments, multiple data transceivers 48 may be utilized that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ connector 50, DQ transceiver 52, and serializer/deserializer 54).

The DQ connector 50 may be, for example a pin, pad, combination thereof, or another type of interface that operates to receive DQ signals, for example, for transmission of data to the memory array 23 as part of a data write operation. Additionally, the DQ connector 50 may operate to transmit DQ signals from the memory device 10, for example, to transmit data from the memory array 23 as part of a data read operation. To facilitate these data reads/writes, a DQ transceiver 52 is present in data transceiver 48. In some embodiments, for example, the DQ transceiver 52 may receive a clock signal generated by the internal clock generator 30 as a timing signal for determining an output timing of a data read operation from the memory array 23. The clock signal transmitted by the internal clock generator 30 may be based upon one or more clocking signals received by the memory device 10 at clock connector 56 (e.g., a pin, pad, the combination thereof, etc.) and routed to the internal clock generator 30 via the clock input circuit 18. Thus, the DQ transceiver 52 may receive a clock signal generated by the internal clock generator 30 as a timing signal for determining an output timing of a data read operation from the memory array 23.

The DQ transceiver 52 of FIG. 2 may also, for example, receive one or more DQS signals to operate in strobe data mode as part of a data write operation. The DQS signals may be received at a DQS connector 60 (e.g., a pin, pad, the combination thereof, etc.) and routed to the DQ transceiver 52 via a DQS transceiver 60 that operates to control a data strobe mode via selective transmission of the DQS signals to the DQ transceiver 52. Thus, the DQ transceiver 52 may receive DQS signals to control a data write operation from the memory array 23.

As noted above, the data transceiver 48 may operate in modes to facilitate the transfers of the data to and from the memory device 10 (e.g., to and from the memory array 23). For example, to allow for higher data rates within the memory device 10, a data strobe mode in which DQS signals are utilized, may occur. The DQS signals may be driven by an external processor or controller sending the data (e.g., for a write command) as received by the DQS connector 58 (e.g., a pin, pad, the combination thereof, etc.). In some embodiments, the DQS signals are used as clock signals to capture the corresponding input data.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from, for example, a host device having a serial format into a parallel format suitable for storage in the memory array 23. Likewise, the serializer/deserializer 54 operates to translate data received from, for example, the memory array 23 having a parallel format into a serial format suitable for transmission to a host device.

Figure 3:
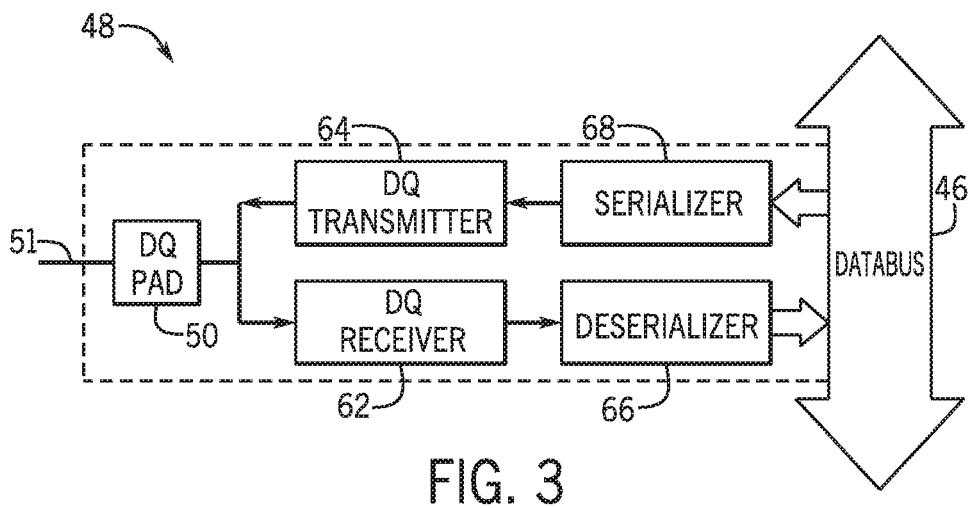
FIG. 3 illustrates a block diagram of an embodiment of the data transceiver of FIG. 2, according to an embodiment of the present disclosure.

FIG. 3 illustrates the data transceiver 48 as including the DQ connector 50 coupled to data transfer bus 51, a DQ receiver 62, a DQ transmitter 64 (which in combination with the DQ receiver 62 forms the DQ transceiver 52), a deserializer 66, and a serializer 68 (which in combination with the deserializer 66 forms the serializer/deserializer 54). In operation, the host (e.g., a host processor or other memory device described above) may operate to transmit data in a serial form across data transfer bus 51 to the data transceiver 48 as part of a data write operation to the memory device 10. This data is received at the DQ connector 50 and transmitted to the DQ receiver 62. The DQ receiver 62, for example, may perform one or more operations on the data (e.g., amplification, driving of the data signals, etc.) and/or may operate as a latch for the data until reception of a respective DQS signal that operates to coordinate (e.g., control) the transmission of the data to the deserializer 66. As part of a data write operation, the deserializer 66 may operate to convert (e.g., translate) data from a format (e.g., a serial form) in which it is transmitted along data transfer bus 51 into a format (e.g., a parallel form) used for transmission of the data to the memory array 23 for storage therein.

Likewise, during a read operation (e.g., reading data from the memory array 23 and transmitting the read data to the host via the data transfer bus 51), the serializer 68 may receive data read from the memory array in one format (e.g., a parallel form) used by the memory array and may convert (e.g., translate) the received data into a second format (e.g., a serial form) so that the data may be compatible with one or more of the data transfer bus 51 and/or the host. The converted data may be transmitted from the serializer 68 to the DQ transmitter 64, whereby one or more operations on the data (e.g., de-amplification, driving of the data signals, etc.) may occur. Additionally, the DQ transmitter 64 may operate as a latch for the received data until reception of a respective clock signal, for example, from the internal clock generator 30, that operates to coordinate (e.g., control) the transmission of the data to the DQ connector 50 for transmission along the data transfer bus 51 to one or more components of the host.

Figure 4:
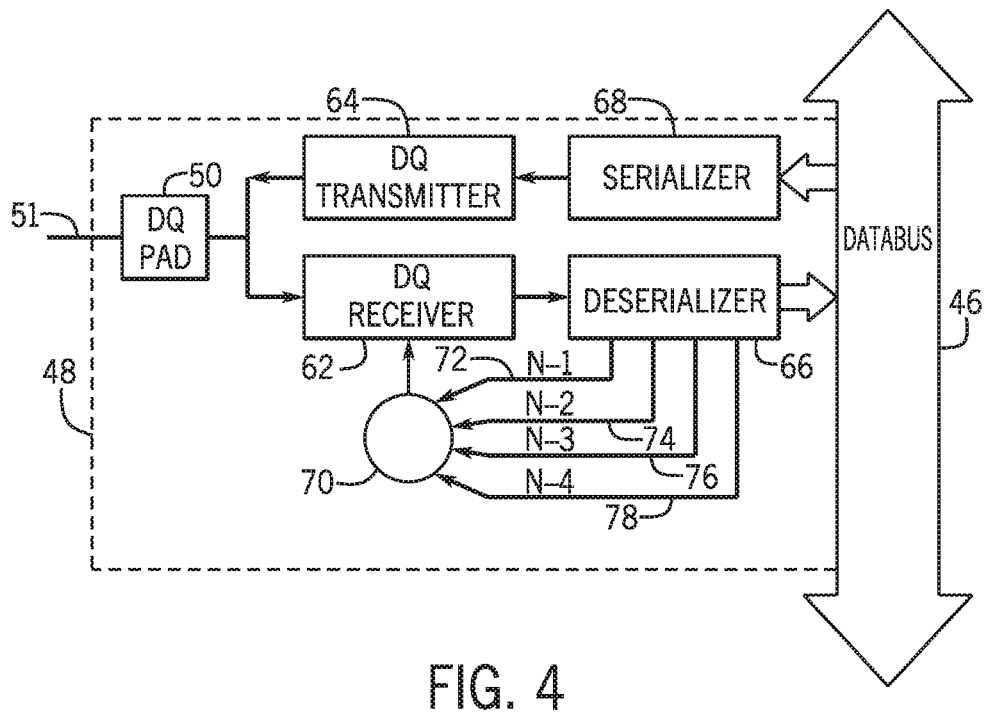
FIG. 4 illustrates a block diagram of a second embodiment of the data transceiver of FIG. 2, according to an embodiment of the present disclosure.

In some embodiments, the data received at the DQ connector 50 may be distorted. For example, data received at the DQ connector 50 may be affected by inter-symbol interference (ISI) in which previously received data interferes with subsequently received data. For example, due to increased data volume being transmitted across the data transfer bus 51 to the DQ connector 50, the data received at the DQ connector 50 may be distorted relative to the data transmitted by the host. One technique to mitigate (e.g., offset or cancel) this distortion and to effectively reverse the effects of ISI is to apply an equalization operation to the data. FIG. 4 illustrates an embodiment of the data transceiver 48 inclusive of an equalizer that may be used in this equalization operation.

FIG. 4 illustrates one embodiment of the data transceiver 48 inclusive of an equalizer, in particular, a decision feedback equalizer (DFE) 70. As illustrated, the DFE 70 is a multi-tap (e.g., four-tap) DFE 70. However, less or more than four taps may be utilized in conjunction with the DFE 70. Likewise, the DFE 70 may be disposed separate from or internal to the deserializer 66 or the DQ receiver 62. In operation, a binary output (e.g., from a latch or decision-making slicer) is captured in one or more data latches or data registers. In the present embodiment, these data latches or data registers may be disposed in the deserializer 66 and the values stored therein may be latched or transmitted along paths 72, 74, 76, and 78.

When a data bit is received at the DQ receiver 62, it may be identified as being transmitted from the host as bit "n" and may be received at a time to as distorted bit n (e.g., bit n having been distorted by ISI). The most recent bit received prior to distorted bit n being received at the DQ receiver 62, e.g., received at time of $t_{-1}$ that immediately precedes time of to, may be identified as n–1 and is illustrated as being transmitted from a data latch or data register along path 72. The second most recent bit received prior to distorted bit n being received at the DQ receiver 62, e.g., received at time of $t_{-2}$ that immediately precedes time of $t_{-1}$, may be identified as n–2 and is illustrated as being transmitted from a data latch or data register along path 74. The third most recent bit received prior to distorted bit n being received at the DQ receiver 62, e.g., received at time of $t_{-3}$ that immediately precedes time of $t_{-2}$, may be identified as n–3 and is illustrated as being transmitted from a data latch or data register along path 76. The fourth most recent bit received prior to distorted bit n being received at the DQ receiver 62, e.g., received at time of $t_{-4}$ that immediately precedes time of $t_{-3}$, may be identified as n–4 and is illustrated as being transmitted from a data latch or data register along path 78. Bits n–1, n–2, n–3, and n–4 may be considered the group of bits that interfere with received distorted bit n (e.g., bits n–1, n–2, n–3, and n–4 cause ISI to host transmitted bit n) and the DFE 70 may operate to offset the distortion caused by the group of bits n–1, n–2, n–3, and n–4 on host transmitted bit n.

Thus, the values latched or transmitted along paths 72, 74, 76, and 78 may correspond, respectively, to the most recent previous data values (e.g., preceding bits n–1, n–2, n–3, and n–4) transmitted from the DQ receiver 62 to be stored in memory array 23. These previously transmitted bits are fed back along paths 72, 74, 76, and 78 to the DFE 70, which operates to generate weighted taps (e.g., voltages) that may be added to or subtracted from the received input signal (e.g., data received from the DQ connector 50, such as distorted bit n) by means of a summer (e.g., a summing amplifier). In other embodiments, the weighted taps (e.g., voltages) may be combined with an initial reference value to generate an offset that corresponds to or mitigates the distortion of the received data (e.g., mitigates the distortion of distorted bit n). In some embodiments, taps are weighted to reflect that the most recent previously received data (e.g., bit n–1) may have a stronger influence on the distortion of the received data (e.g., distorted bit n) than bits received at earlier times (e.g., bits n–1. n–2, and n–3). The DFE 70 may operate to generate magnitudes and polarities for taps (e.g., voltages) due to each previous bit to collectively offset the distortion caused by those previously received bits.

For example, for the present embodiment, each of previously received bits n–1, n–2, n–3, and n–4 could have had one of two values (e.g., a binary 0 or 1), which was transmitted to the deserializer 66 for transmission to the memory array 23 and, additionally, latched or saved in a register for subsequent transmission along respective paths 72, 74, 76, and 78. In the illustrated embodiment, this leads to sixteen (e.g., $2^4$) possible binary combinations (e.g., 0000, 0001, 0010, . . . , 1110, or 1111) for the group of bits n–1, n–2, n–3, and n–4. The DFE 70 operates to select and/or generate corresponding tap values for whichever of the aforementioned sixteen combinations are determined to be present (e.g., based on the received values along paths 72, 74, 76, and 78) to be used to adjust either the input value received from the DQ connector 50 (e.g., distorted bit n) or to modify a reference value that is subsequently applied to the input value received from the DQ connector 50 (e.g., distorted bit n) so as to cancel the ISI distortion from the previous bits in the data stream (e.g., the group of bits n−1, n−2, n−3, and n−4).

Use of distortion correction (e.g., a DFE 70) may be beneficial such that data transmitted from the DQ connector 50 is correctly represented in the memory array 23 without distortion. Accordingly, it may be useful to store the previous bit data to use in the distortion correction. As illustrated in the block diagram of FIG. 5, a distortion correction circuit 80 may be included as part of the DQ receiver 62 but may not be required to be physically located there (e.g., the distortion correction circuit 80 may instead be coupled to the DQ receiver 62). In some embodiments, the distortion correction circuit 80 may be operated to provide previously transmitted bit data to correct a distorted bit 81 (e.g., bit having been distorted by ISI and/or system distortions) transmitted via a channel 84 (e.g., connection, transmission line, and/or conductive material).

The distorted bit 81 may be transmitted to an amplifying device 82 (e.g., variable gain amplifier) from a channel 84. The distorted bit 81 may be transmitted from the amplifying device 82 to the DFE 70, illustrated as having a single weighted tap 86. The distorted bit 81 may be transmitted simultaneously with a DQ reference signal 83 to the DFE 70. The DQ reference signal 83 may represent a threshold value (e.g., a voltage level) for determination if the transmitted bit received by the DQ connection 50 was a logical low (e.g., 0) or a logical high (e.g., 1).

The DFE 70 may be operated to correct the distortion from the distorted bit 81 using the tap weighted with previous bit data (e.g., n−1 bit data). Data (e.g., logical 1 or logical 0) for an n−1 bit may be transmitted through the path 72. The magnitudes and polarities of the single weighted tap 86 may offset the total distortion caused by the n−1 bit via summer circuit 85, which operates as a current summer that applies current to the distorted bit 81 to offset for distortion caused by the n−1 bit. For example, if the received bit at the DQ connection 50 is determined to be below the DQ reference signal 83, the received bit 81 is transmitted to the memory array 23 as a logical low. The magnitude and polarity of the weighted tap 86 may be able to correct the distorted bit 81 and the DQ reference signal 83.

A modified version of the distorted bit 81 and a modified version of the DQ reference signal 83 may be transmitted to a data latch 94. A corrected bit 88 may be generated via the data latch 94 and transmitted from the data latch 94 to the deserializer 66, which may occur on the rising edge of the DQS signal 96. In other embodiments, variations of the clocking scheme may be followed to be inclusive of additional or alternative methods of data transmission. The value for the new n−1 bit may be stored, for example, in the deserializer 66 for transmission along the path 72 when the corrected bit 88 is received in the deserializer 66. The distortion correction circuitry associated with the DFE 70 and the amplifying device 82 may be described in greater detail below.

Figure 5:
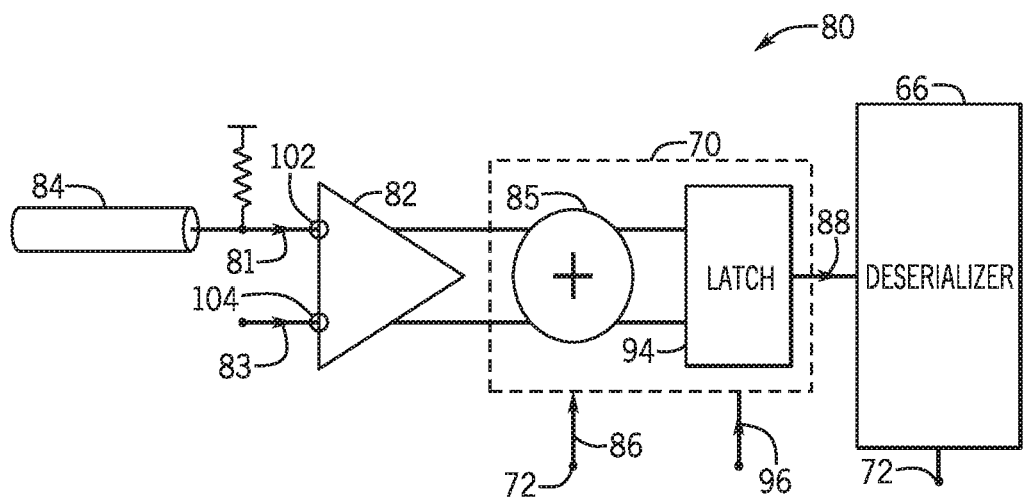
FIG. 5 illustrates a block diagram of a distortion correction circuit, according to an embodiment of the present disclosure.
Figure 6:
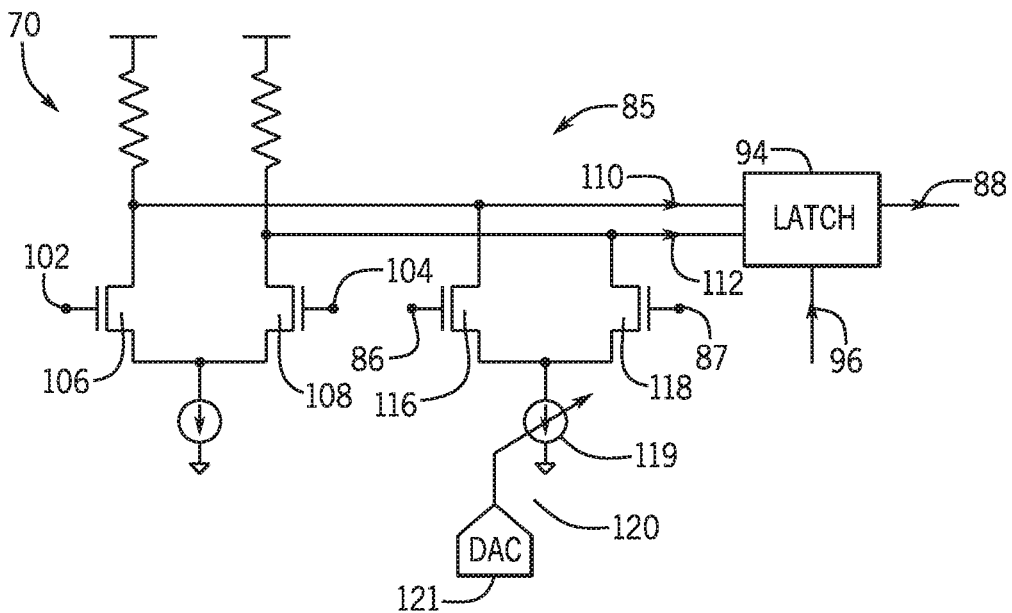
FIG. 6 illustrates a circuit diagram of a portion of the decision feedback equalizer (DFE) of FIG. 5, according to an embodiment of the present disclosure.

FIG. 6 illustrates a circuit diagram of a portion of the DFE 70 of FIG. 5 that may negate distortions associated with the distorted bit 81. Data bits may be received at a first input 102 and a second input 104 to the summer circuit 85. The first input 102 and the second input 104 may be communicatively coupled to a device that may be enabled or disabled (e.g., coupled to supply a gate signal to the field effect transistors 106 and 108). The distorted bit 81 may be received by the first input 102 and the DQ reference signal 83 may be received by the second input 104. In this manner, two of the field effect transistors 106 and 108 may be controlled by the distorted bit 81 and the DQ reference signal 83.

The weighted tap 86 and its inverse value (e.g., inverse weighted tap 87) may be transmitted to the outputs 110 and 112 to correct the distortion in the distorted bit 81. A logical high for the n−1 bit is transmitted through the path 72. In this case, the n−1 bit may be implemented to generate the weighted tap 86 and the inverse weighted tap 87 as a control signal for two field effect transistors 116 and 118 enabling the contribution of the weighted tap values 86 and 87 to the outputs 110 and 112.

The weighted tap values 86 and 87 may allow for current to be applied to outputs 110 and 112, whereby the current supplied is controlled through a controllable source 120 (e.g., a current source 119 controlled by a digital to analog (DAC) converter 121). The outputs 110 and 112 may be modified values of one or more of the DQ reference signal 83 and the distorted bit 81 and may be transmitted to the data latch 94 (e.g., a regenerative latch or slicer that generates a binary output). The corrected bit 88 may be generated via the data latch 94 based on the outputs 110 and 112 and may be transmitted to the deserializer 66 on the rising edge of the DQS signal 96. The n−1 bit information stored for transmission along the path 72 in the deserializer 66 may be updated with the corrected bit 88 for future distortion corrections.

Figure 7:
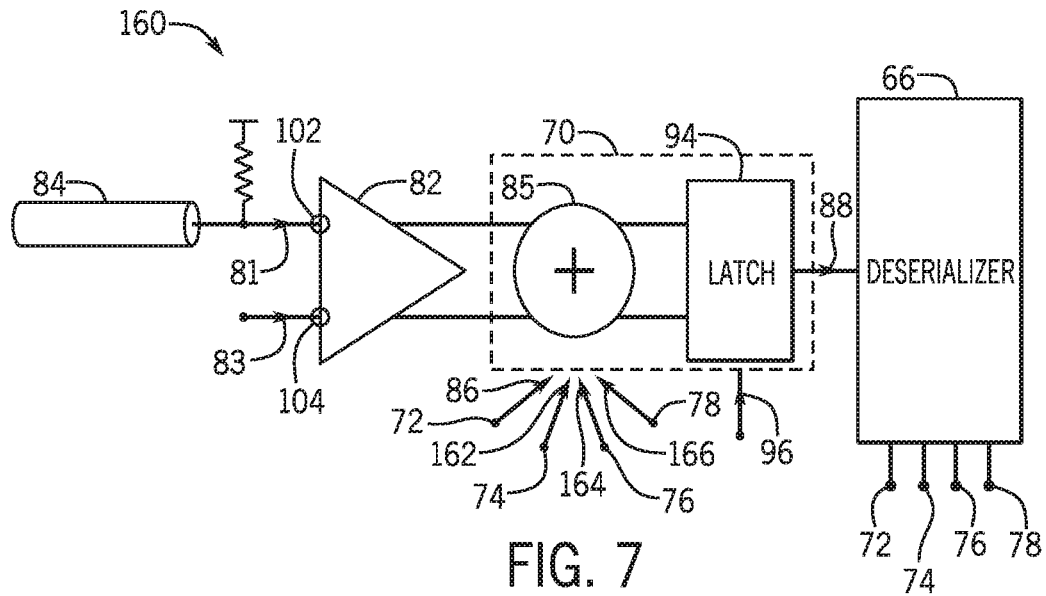
FIG. 7 illustrates a second embodiment of a distortion correction circuit, according to an embodiment of the present disclosure.

In some applications, the corrected bit 88 may need to have a greater level of precision of adjustment than the weighted taps 86 and 87 may otherwise provide. FIG. 7 illustrates a block diagram of a distortion correction circuit 160 that may receive four bits of previous data (e.g., n−1 bit data, n−2 bit data, n−3 bit data, and n−4 bit data) to create four weighted taps 86, 162, 164, and 166 to perform a more precise distortion correction to the distorted bit 81. In a similar manner to the distortion correction circuit 80, the distorted bit 81 may be transmitted to the amplifying device 82 via the channel 84. The DQ reference signal 83 may also be transmitted to the amplifying device 82.

From the amplifying device 82, the distorted bit 81 and the DQ reference signal 83 may be transmitted to the DFE 70. Bit data for the previous bits may be transmitted through the paths 72, 74, 76, and 78. The DFE 70 may be operated to correct the distortion from the distorted bit 81 using the four weighted taps 86, 162, 164, and 166 created from the bit data for the four previous bits. The DFE 70 may be operated to generate magnitudes and polarities for each of the weighted taps 86, 162, 164, and 166 for each of the previous bits transmitted along paths 72, 74, 76, and 78 which may be designed to offset the total distortion to the distorted bit 81 caused by the previously received bits.

One or more of a modified version of the distorted bit 81 and a modified version of the DQ reference signal 83 may be transmitted to the data latch 94. The corrected bit 88 may be transmitted to the deserializer 66 on the rising edge of the DQS signal 96 from the data latch 94. The deserializer 66 may be updated with the values for the n−1 bit, n−2 bit, n−3 bit, and the n−4 bit and the values may be stored for transmission along the paths 72, 74, 76, and 78. The distortion correction circuitry associated with the DFE 70 may be described in greater detail below.

Figure 8:
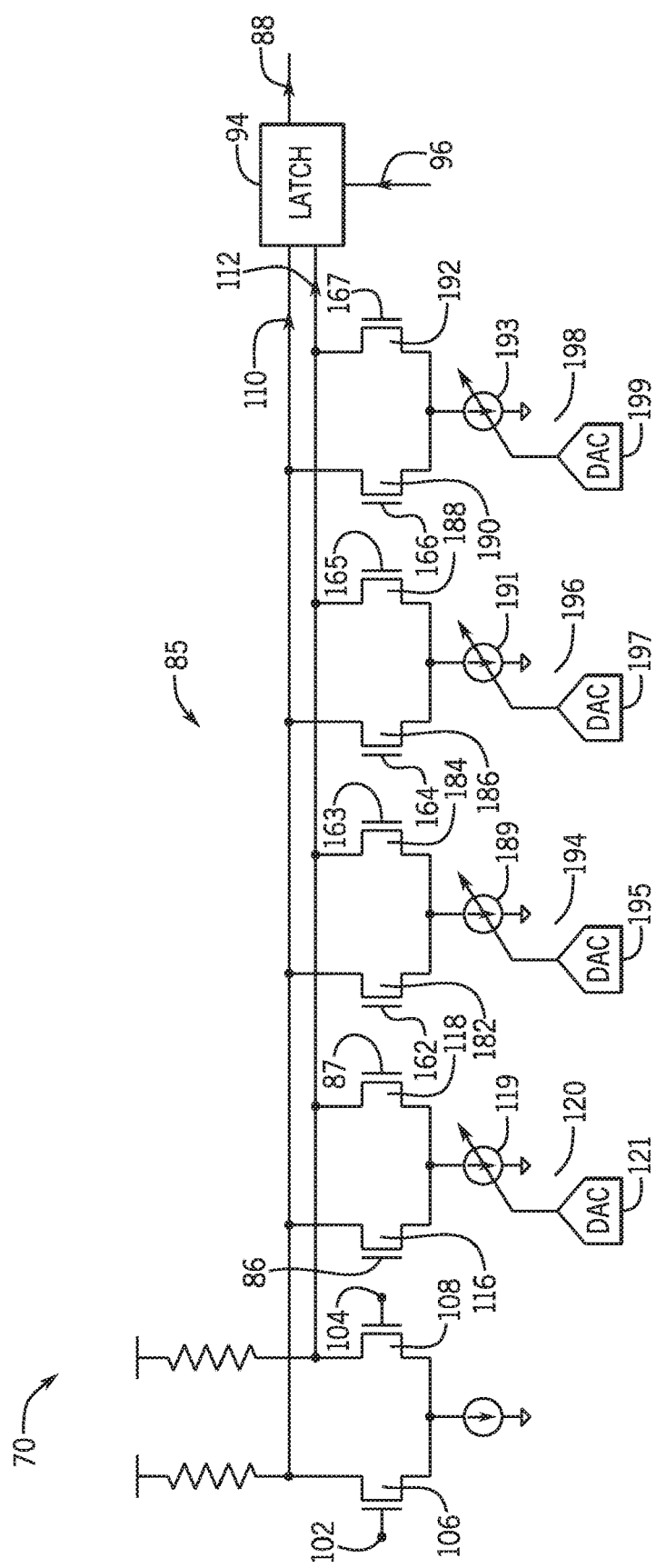
FIG. 8 illustrates a circuit diagram of a portion of the DFE of FIG. 7, according to an embodiment of the present disclosure.

FIG. 8 illustrates a circuit diagram of a portion of the DFE 70 of FIG. 7 that may negate distortions. As additionally illustrated in FIG. 8, the DFE 70 may receive a logical high or low for the n−1 bit, the n−2 bit, the n−3 bit, or the n−4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, and 167 as control signals for the field effect transistors 116, 118, 182, 184, 186, 188, 190, and 192 to control outputs therefrom transmitted to the outputs 110 and 112. The field effect transistors 116, 118, 182, 184, 186, 188, 190, and 192 may be selectively and controllably activated to reflect one of the sixteen (e.g., 24) different possible binary states represented by the various combinations of previously corrected bits (e.g., 0000, 0001, 0010, ... 1111).

The weighted tap 86, 87, 162, 163, 164, 166 and 167 values may be applied to the outputs 110 and 112, whereby the current supplied is controlled through the controllable source 120 and additional controllable sources 194, 196, and 198 (e.g., each having a respective current source 119, 189, 191, and 193 controlled by a DAC 121, 195, 197, 199). The outputs 110 and 112 may be transmitted to the data latch 94. The corrected bit 88 may be generated via the data latch 94 based upon the outputs 110 and 112 and may be transmitted to the deserializer 66 on the rising edge of the DQS signal 96. The n−1 bit, the n−2 bit, the n−3 bit, and the n−4 bit information stored for transmission along the paths 72, 74, 76, and 78 in the deserializer 66 may be updated with the corrected bit 88 (e.g., n−4 bit will update to reflect n−3 data, n−3 bit will update to reflect n−2 data, n−2 data will update to reflect n−1 data, and n−1 data will update with the newly corrected bit) for future distortion corrections.

In some embodiments, the DAC 121 may alter and/or control the current contribution of the controllable source 120 and additional DACs 195, 197, and 199 may alter and/or control the current contribution of the additional controllable sources 194, 196, and 198 by controlling the respective current sources 119, 189, 191, and 193. In such embodiments, the DACs 121, 195, 197, and 199 may include a fixed circuit capable of supplying a specified output (e.g., voltage) to the current sources 119, 189, 191, and 193. As such, the DACs 121, 195, 197, and 199 may supply the same outputs to inputs of the respective current sources 119, 189, 191, and 193 regardless of variations in PVT conditions (e.g., variations in operating temperatures outside standard operating conditions). In other embodiments, the DACs 121, 195, 197, and 199 may generate outputs that change as a result of PVT conditions, however, the changes outputs may not always vary in a suitable and/or controllable manner. That is, for a given set of PVT conditions, there may not exist a direct relationship between the outputs of the DACs 121, 195, 197, and 199 and the outputs of the current sources 119, 189, 191, and 193 (e.g., the resulting outputs of the controllable sources 120, 194, 196, and 198). As such, even if the outputs of the DACs 121, 195, 197, and 199 and the resulting outputs of the current sources 119, 189, 191, and 193 are both influenced by PVT conditions, as the PVT conditions change, the DAC output required to suitably control a controllable source so that it contributes a suitable current from a respective weighted tap (e.g., 86, 162, 164, 166) to accurately reflect conditions affecting the DFE 70 may also change. For example, to modify the current of the outputs 110 and 112 by a specified current for a set of PVT conditions, the controllable source 120 may utilize a first input level received from the DAC 121. To modify the current of the outputs 110 and 112 by the same specified current for a different set of PVT conditions, a second input level at the controllable source 120 from the DAC 121 may be suitable. Thus, the DACs 121, 195, 197, and 199 may provide fixed outputs and/or outputs incapable of adjusting suitably across varying PVT conditions to adjust the outputs of the current sources 119, 189, 191, and 193 so that the controllable sources 120, 195, 197, and 199 correctly operate to compensate for varying conditions affecting the DFE 70.

Figure 9:
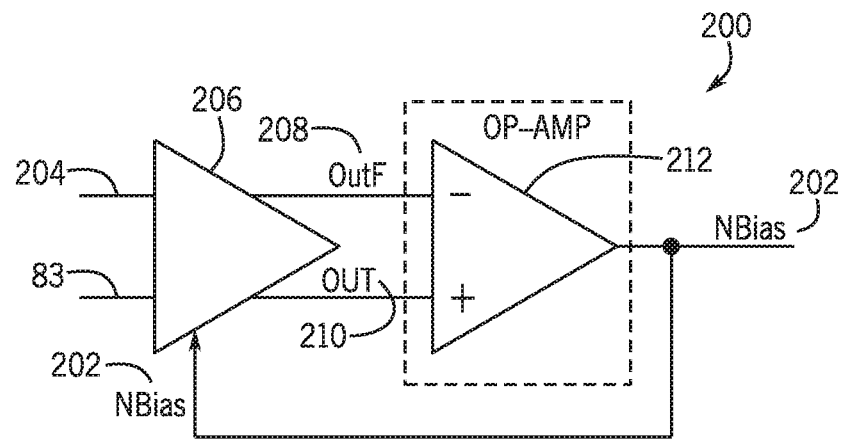
FIG. 9 illustrates a block diagram of an embodiment of a bias generator, according to an embodiment of the present disclosure.

Accordingly, FIG. 9 illustrates a bias generator 200 that may generate PVT tolerant bias levels to suitably adjust the controllable sources 120, 194, 196, and 198 of FIG. 8, regardless of the PVT conditions. That is, in place of the DACs 121, 195, 197, and 199 illustrated in FIG. 8, an output of the bias generator 200 may be communicatively coupled to, for example, the input of the current sources 119, 189, 191, and 193 to control the output thereof and, accordingly, the output of the controllable sources 120, 194, 196, and 198.

In some embodiments, the bias generator 200 may accept two inputs, DQ reference signal 83 and a modified DQ reference signal 204 and may output a bias level NBias 202 suitable to control the controllable source 120. The input DQ reference signal 83 may represent the same signal DQ reference signal 83 input to the DFE 70 in FIG. 7. That is, DQ reference signal 83 may represent a threshold value (e.g., a voltage level) for determination if the a bit received by the bias generator 200 was a logical low (e.g., 0) or a logical high (e.g., 1). The second input, modified DQ reference signal 204 may represent the combination of a correction factor "X" (e.g., 5 mV) added to the DQ reference signal 83. The correction factor X may represent a level of correction (e.g., distortion removal) to result in a desired output for the controllable source 120, 194, 196, and 198. That is, to adjust the data (e.g., a bit) on the data channel by a certain amount (e.g., 5 mv) to, for example, generate corrected bit 88, the correction factor X may match this amount. As such, the correction factor X may adjust the outputs 110 and 112 of the summer circuit 85 by some level multiplied by a gain (e.g., Gain*X), as the outputs 110 and 112 may have additional gain applied by, for example, an amplifying device 82. Further, in some embodiments, the desired level of correction contributed by each weighted tap 86, 162, 164, and 166 in the summer circuit 85 may be programmed and/or adjusted by a user in order to suitably calibrate the memory device 10. That is, each weighted tap 86, 162, 164, and 166 may be set to adequately remove distortion from the data channel, and because the correction applied to the outputs 110 and 112 may depend on a combination of the weighted taps 86, 162, 164, and 166 and the controllable sources 120, 194, 196, and 198, the correction factor X may also be based on a programmed and/or user adjusted value.

Although the desired level of correction may be received as part of an input (e.g., correction factor X) to the bias generator 200, at any set of PVT conditions, the suitable bias level (e.g., NBias 202) for the bias generator 200 to input to the current source 119, 189, 191, or 193 in order to generate a suitable amount of current correction may not be known. That is, there may not exist a direct and/or well-defined relationship between the bias level NBias 202 output by the bias generator 200 and the resulting current generated by the controllable source 120. As a result, there may also not exist a direct and/or well-defined relationship between the bias level NBias 202 and the correction applied by the summer circuit 85. Thus, in some embodiments, to determine the suitable bias level NBias 202 output, the bias generator 200 may first receive the desired correction level (e.g., correction factor X) as an input and determine the bias level NBias 202 resulting from this correction level, as will be described further.

In such embodiments, the DQ reference signal 83 and the modified DQ reference signal 204 may be applied to a receiver 206 emulating the DQ receiver 62, as further described below. That is, the correction factor X may be applied to the receiver 206 so that the behavior resulting from applying the correction factor X to the DQ receiver 62 may be determined. As such, the receiver 206 may output signals OutF 208 and Out 210 that may correspond to the input signals modified DQ reference signal 204 and DQ reference signal 83, as adjusted to the behavior of the DQ receiver 62.

In some embodiments, the outputs of the receiver 206 (e.g., OutF 208 and Out 210) may feed into an operational amplifier (op-amp) 212, such as a differential amplifier. The op-amp 212 may determine the difference between OutF 208 and Out 210 and multiply this difference by a gain before outputting the result, bias level NBias 202. In some embodiments, the resulting bias level NBias 202 may feedback into the receiver 206 so that the Out 210 and/or OutF 208 signals may be adjusted until they are nearly equal (e.g., until the op-amp 212 stabilizes the value of the bias level NBias 202). As such, the bias generator 200 may work to determine a suitable bias level NBias 202. That is, after applying a correction factor X to DQ reference signal 83 (e.g., modified DQ reference signal 204), the results (e.g., OutF 208 and Out 210) of the receiver 206 may be compared (e.g., by the op-amp 212) and subsequently adjusted to determine the bias level NBias 202 value required to equalize OutF 208 and Out 210. Thus, the stabilized bias level NBias 202 may represent a suitable bias level for the receiver 206 to correct the DQ reference signal 83 to the modified DQ reference signal 204 (e.g., for Out 210 to equal OutF 208), or to implement the desired correction level.

Because the bias generator 200 may emulate a set of PVT conditions of the DQ receiver 62 in the receiver 206 and may use bias level NBias 202 in a feedback loop, bias level NBias 202 may stabilize at a bias level suitable to control one of the current sources 119, 189, 191, and 193 to which it is coupled to control the output thereof and, accordingly, the output of the controllable sources 120, 194, 196, and 198 in connection with the PVT conditions. As the PVT conditions change, the bias level NBias 202 may stabilize at a different bias level that is suitable to control the controllable source 120 at the updated PVT conditions. Further, the value of bias level NBias 202 may stabilize when the outputs (e.g., OutF 208 and Out 210) are nearly equal as a result of limitations of op-amps (e.g., op-amp 212). As such, an op-amp with high gain may be used to decrease the error (e.g., reduce the difference) between the final outputs (e.g., OutF 208 and Out 210). Further, with high gain, the small difference between the nearly equal OutF 208 and Out 210 may be multiplied number into a detectable bias level NBias 202 that may suitably control the controllable source 120 so that the appropriate current correction may be made in the summer circuit 85.

Figure 10:
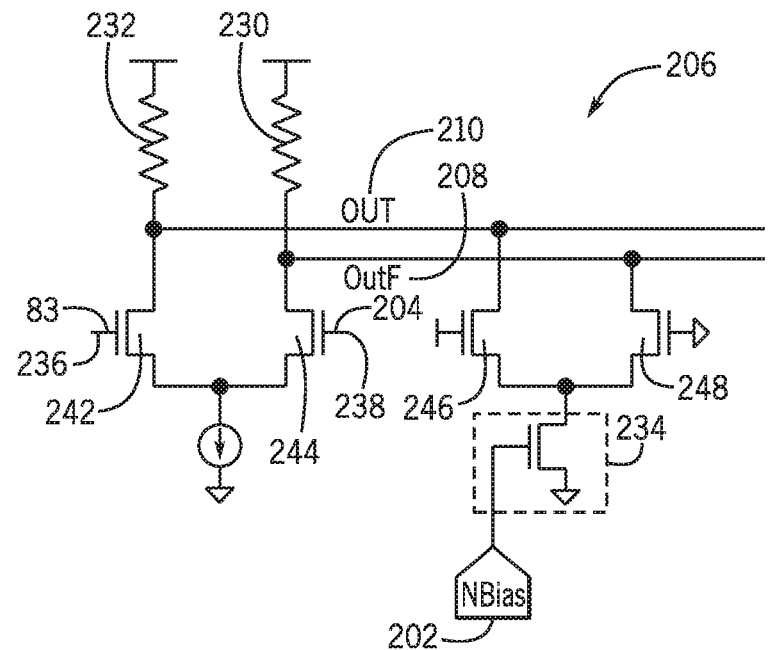
FIG. 10 illustrates an embodiment of a receiver of the bias generator of FIG. 9, according to an embodiment of the present disclosure.

Turning now to FIG. 10, a more detailed embodiment of the receiver 206 is provided. While the embodiment is referred to as a receiver, it should be noted that receiver 206 receives data signals generated internal to memory device 10 and may be used to emulate the operation conditions, including PVT conditions, of other receivers (e.g., DQ receiver 62). In the illustrated embodiment, the DQ receiver 62 is emulated, and more specifically, the summer circuit 85 of the DQ receiver 62 is emulated. While not shown in the illustrated embodiment, in some embodiments, the receiver 206 may additionally contain an amplifying device to emulate the amplifying device 82 that the DQ receiver 62 may contain.

In the illustrated embodiment, similar to the summer circuit 85, the receiver 206 may adjust the outputs 210 and/or 208 of the circuit. The receiver may receive the DQ reference signal 83 at a first input 236 and the modified DQ reference signal 204 at a second input 238. The first input 236 and the second input 238 may enable or disable to the field effect transistors 242 and 244 (e.g., may supply a gate signal to the field effect transistors 242 and 244). In this manner, the field effect transistors 242 and 244 may be controlled by the DQ reference signal 83 and the modified DQ reference signal 204.

A controllable source 234 coupled to a pair of field effect transistors 246 and 248 may apply current to the outputs Out 210 and OutF 208 under the control of the bias level NBias 202. The outputs Out 210 and OutF 208 may represent modified values of the DQ reference signal 83 and the modified DQ reference signal 204, respectively. As such, in some embodiments, because the modified DQ reference signal 204 is greater than DQ reference signal 83 (e.g., by correction factor X mV) the output OutF 208 corresponding to the modified DQ reference signal 204 may be greater than Out 210. Thus, the receiver 206 may use a resistive load 232 to pull the Out 210 signal up (e.g., higher) to a value closer to the value of OutF 208. In the case that the value of Out 210 is greater than the value of OutF 208, the receiver 206 may use bias level NBias 202 to pull the Out 210 signal down (e.g., lower) to bring a value closer to the value of OutF 208. The resulting values of Out 210 and OutF 208 may then feed into the op-amp 212, as illustrated in FIG. 9, where the most recent difference between Out 210 and OutF 208 may be determined to generate a resulting NBias 202 value. As the NBias 202 may feedback into the receiver 206, the difference between the Out 210 and OutF 208 values may continuously update. Further, the difference between the Out 210 and OutF 208 values may continuously dictate the manner in which the receiver 206 adjusts the Out 210 signal via bias level NBias 202 and/or the resistive load 232.

Figure 11:
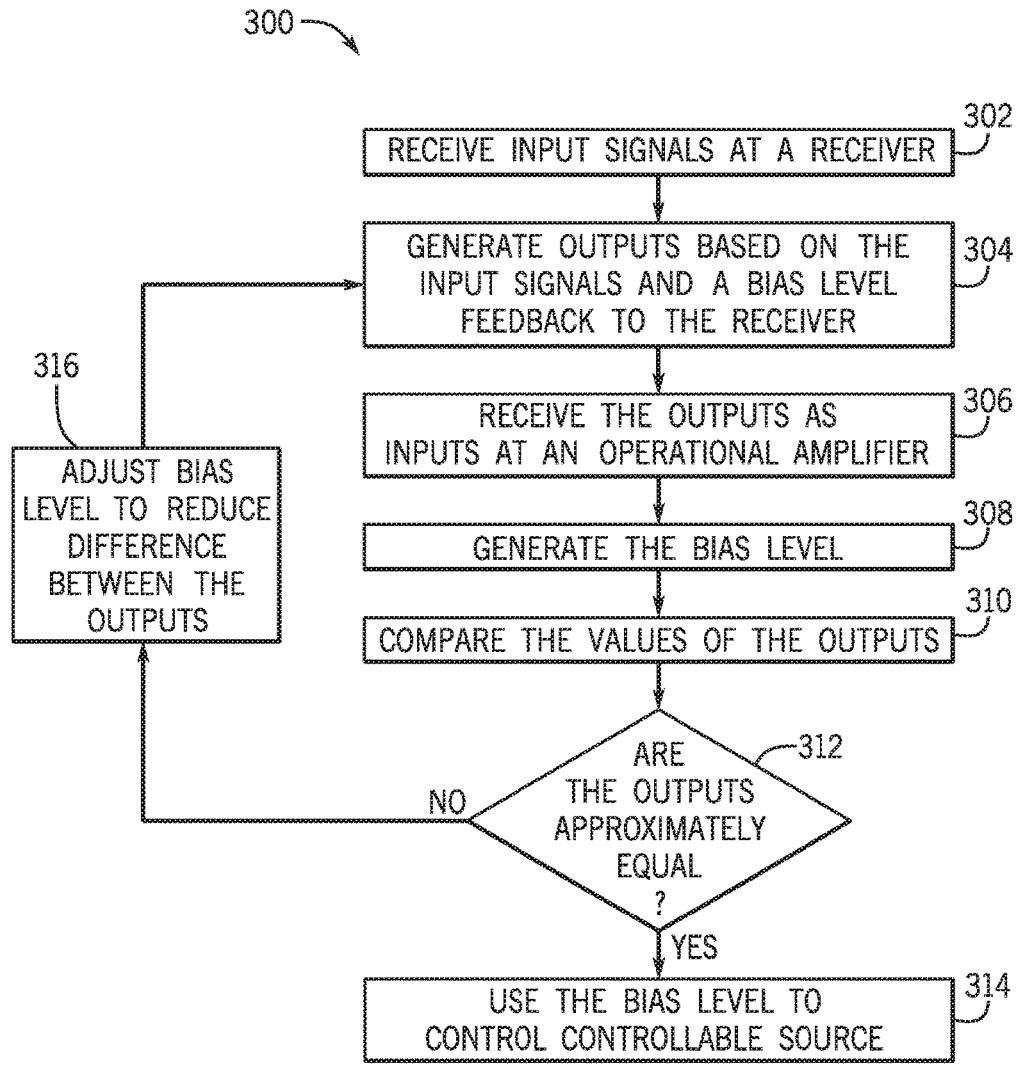
FIG. 11 illustrates a flow chart of an embodiment of a method of the bias generator of FIG. 9 to generate bias levels, according to an embodiment of the present disclosure.

With the foregoing in mind, FIG. 11 illustrates a flow chart of a method 300 for generating the suitable bias level NBias 202 to control the controllable source 120, regardless of the PVT conditions, in accordance with embodiments described herein. Although the following description of the method 300 is described in a particular order, which represents a particular embodiment, it should be noted that the method 300 may be performed in any suitable order, and steps may be added or omitted.

At block 302, the bias generator 200 may receive input signals, the DQ reference signal 83 and the modified DQ reference signal 204 at receiver 206. As illustrated in FIG. 10, in some embodiments, these input signals may be received at a first input 236 and a second input 238 in the receiver 206. At block 304, the receiver 206 may then generate outputs Out 210 and OutF 208 based on the input signals (e.g., the DQ reference signal 83 and the modified DQ reference signal 204) and the feedback bias level NBias 202. As discussed earlier, block 304 may involve pulling Out 210 up or down using the resistive load 232 or bias level NBias 202, respectively. Further, pulling Out 210 up or down and the level at which the value of Out 210 is modified may depend on bias level NBias 202, which may control the current contribution of the controllable source 234. The signals output from the receiver 206 (e.g., Out 210 and OutF 208) may then feed into an op-amp 212 at block 306 (illustrated in FIG. 9). At block 308, the op-amp 212 may generate the bias level NBias 202, according to the equation:

NBias=Gain*(Out−OutF)

The Gain term may represent a large number determined by the operating characteristics of the op-amp 212 used. In some embodiments, this calculation may occur concurrently with block 310, where the values of Out 210 and OutF 208 are compared in the equation above to calculate bias level NBias 202. At block 312, if Out 210 and OutF 208 are approximately equal (e.g., the op-amp 212 has stabilized the bias level NBias 202 and/or the difference between Out 210 and OutF 208 is indistinguishable to the op-amp 212, given its operating capabilities), then the bias level NBias 202 may be used to control the controllable source 120. With the control of the stabilized bias level NBias 202, the controllable source 120 may, at block 314, generate a suitable correction in the summer circuit 85. In some embodiments, at block 312, if Out 210 and OutF 208 are not approximately equal, the op-amp 212 may, at block 316 adjust the value of bias level NBias 202 to reduce the difference between Out 210 and OutF 208. The NBias 202 adjusted at block 316 may then feedback into the receiver 206. As a result, at block 304, the receiver 206 may receive the adjusted bias level NBias 202 and may regenerate the outputs Out 210 and OutF 208 based on the adjusted bias level NBias 202 and the input signals DQ reference signal 83 and the modified DQ reference signal 204 and may continue through method 300 to generate a suitable Nbias 202 to control the controllable source 120.

Further, while bias level NBias 202 has been described as either being fed back at from block 316 to the receiver 206 or used to control the controllable source 120 depending on the result of the comparison at block 312, to one skilled in the art, it should be understood that these actions may occur simultaneously. Further, these bias level NBias 202 actions may occur regardless of the result of the comparison at block 312. That is, in the illustrated embodiment of FIG. 9, the bias generator 200 may not contain any circuitry and/or logic to gate bias level NBias 202 as it is output to the controllable source 120 and/or as it is fed back into the receiver 206. As such, the receiver 206 and the controllable source 120 may continuously receive bias level NBias 202, regardless of the difference between Out 210 and OutF. That is, receiver 206 and controllable source 120 may continue to receive bias level NBias 202 regardless of whether bias level NBias 202 has stabilized or not. However, in some embodiments, the op-amp 212 may stabilize bias level NBias 202 before the summer circuit 85 is ready to use bias level NBias 202. That is, the DQS receiver 62 and/or the memory device 10 may include an initialization procedure that may include certain delays to allow their systems to power on and calibrate (e.g., stabilize) certain values (e.g., bias level NBias 202) adequately before they may be used.

In some embodiments, the contribution of each weighted tap 86, 162, 164, and 166 to the outputs 110 and 112 may require a different bias level (e.g., NBias 162) applied to each of the controllable sources 120, 194, 196, and 198, respectively. As such, in the embodiment illustrated in FIG. 8, a set of different bias levels may control each of the current sources 119, 189, 191, and 193 such that the outputs of the respective controllable sources 120, 194, 196, and 198 are different. Further, with reference to FIGS. 1 and 4, the data transceiver 48 may include a DQ connector 50 for each data IO signal (e.g., within DQ<15:8> and DQ<7:0>). Thus, while the embodiments described herein may depict the local generation of a bias level for a single controllable source 120 for a DFE 70 receiving a single data IO signal (e.g., an individual DQ connector 50), in some embodiments, each data IO signal may benefit from correction. That is, each data IO signal may connect to a different DQ connector 50. As such, a DFE 70 circuit may reduce distortion, which may involve the use of different bias levels generated by a bias generator 200, in each of the data IO signals.

As such, to efficiently generate the necessary bias values for use across different taps in a DFE summer 85 and/or across different data IO signals, the memory device 10 may include systems and methods to globally generate bias levels. That is, instead of or in addition to locally generating different bias levels (e.g., with separate bias generators 200) for each data IO signal at runtime based on programmed values and/or user input, the memory device 10 may include a number of different generated bias levels that are simultaneously available globally (e.g., to all of the necessary regions of the device) to be selected at runtime.

Figure 12:
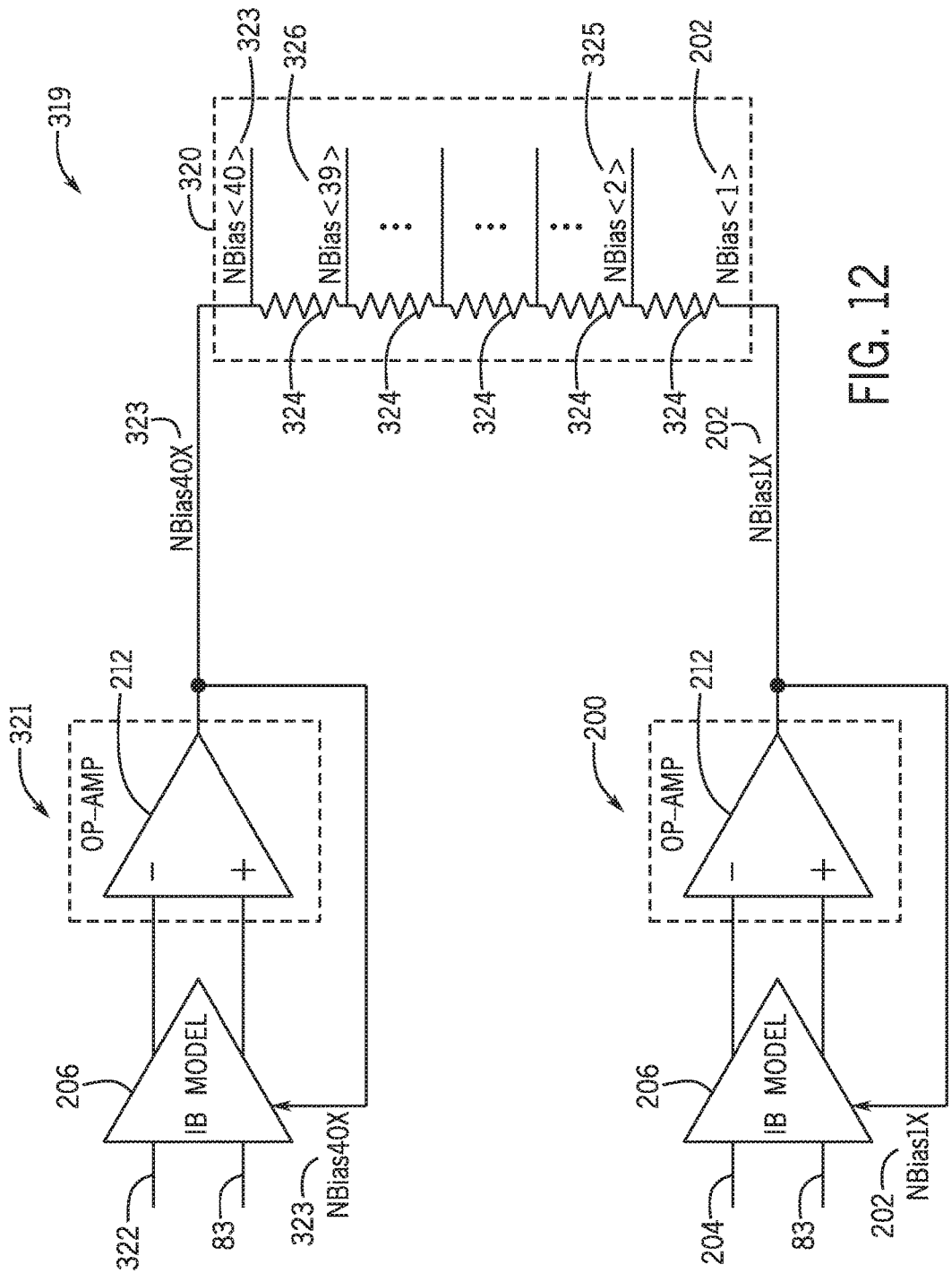
FIG. 12 illustrates a block diagram of an embodiment of a multi-level bias generator, according to an embodiment of the present disclosure.

Accordingly, FIG. 12 illustrates an embodiment of a multi-level bias generator 319 capable of simultaneously generating a plurality of bias levels. In some embodiments, the multi-level bias generator 319 may include a voltage divider 320 coupled between the outputs of a set of two or more bias generators 200 (e.g., 200 and 321). In such embodiments, a first bias generator 200 may receive DQ reference signal 83 and modified DQ reference signal 204 as inputs, while a second bias generator 321 may receive DQ reference signal 83 and an additional modified DQ reference signal 322 as inputs. The inputs to the first bias generator 200 and the second generator 321 may represent boundary conditions handled by a bias generator 200. That is, the modified DQ reference signal 204 may represent a correction factor X (e.g., 1X) added to the DQ reference signal 83, where the correction factor X may represent a non-zero value that may indicate the smallest meaningful (e.g., detectibly impacting an output) step size between DQ reference signal 83 and modified DQ reference signal 204 for a bias generator 200. Further, the additional modified DQ reference signal 322 may represent 40X (e.g., 40*X) added to the DQ reference signal 83, where 40X may represent the maximum step size between the DQ reference signal 83 and the additional modified DQ reference signal 322 that is meaningful to (e.g., influences) the bias generator 200. As a result of the boundary conditions applied at the input of the first bias generator 200 and the second bias generator 321, the output NBias1X 202 of the first bias generator 200 may represent an output bias level on the low end of the first bias generator's 200 operating conditions, while the output NBias40X 323 of the second bias generator 321 may represent an output bias level on the high end of the second bias generator's 321 operating conditions. As such, a range of possible bias level outputs from a bias generator 200 may exist between the two outputs (e.g., NBias1X 202 and NBias40X 323).

While the foregoing description of the boundary condition inputs (e.g., modified DQ reference signal 204 and additional modified DQ reference signal 322) utilizes correction factors 1X and 40X, it should be noted that any suitable boundary correction factors may be used. In some embodiments, correction factors that may encompass the range of bias levels used by the memory device 10 may be desirable. As such, in some embodiments, equal values for the boundary condition inputs may not be desirable. Further, a correction factor of 0 millivolts may not represent a suitable correction factor, as the bias generator 200 may turn off if there is no difference between DQ reference signal 83 and modified DQ reference signal 204. However, the embodiments described herein should not be limited to the examples expressly recited.

In some embodiments, the voltage divider 320 may include a number of resistive elements 324 (e.g., resistors, capacitors, inductors, or any suitable combination thereof) that may divide the first bias level output NBias1X 202 and the second bias level output NBias40X 323 into a number of different bias level outputs (e.g., 325-326). That is, the voltage divider 320 may interpolate a number of bias level outputs between the first bias level output NBias1X 202 and the second bias level output NBias40X 323. More specifically, in some embodiments, the voltage divider 320 may interpolate a bias level output corresponding to each bias generator 200 input value from modified DQ reference signal 204 to additional modified DQ reference signal 322, with a step size of X (e.g., 40 different bias level outputs).

The bias level outputs (e.g., 202, 323, 325, and 326) may be output directly from a bias generator 200 (e.g., 200 or 321) or output between a set of resistive elements 324 (e.g., resistors). As such, the resistance applied by resistive elements 324 may determine the level of each of the bias level outputs (e.g., 202, 323, 325, and 326). Further, the resistive contribution of each of the resistive elements 324 in the voltage divider 320 may determine the relationship between bias level outputs (e.g., 202, 323, 325, and 326). For example, a voltage divider 320 with a number of resistors with suitable resistances may generate bias level outputs (e.g., 202, 323, 325, and 326) that are linearly related.

Because the bias level outputs (e.g., 202, 323, 325, and 326) may control the current sources 119, 189, 191, and 193 which in turn, impact the current contributed by the controllable sources 120, 194, 196, and 198 to the outputs 110 and 112, in some embodiments, an inverse square relationship between consecutively generated bias level outputs (e.g., 325 and 326) may be desirable. That is, because the current supplied by the field effect transistors 116, 118, 182, 184, 186, 188, 190, and 192 may adjust based on a square function of a voltage supplied to the current sources 120, 194, 196, and 198 the bias level outputs may be generated based on an inverse square function to linearize the adjustments made to the current supplied by the field effect transistors 116, 118, 182, 184, 186, 188, 190, and 192 between bias level outputs. In other embodiments, however, a linear or any other suitable relationship between bias level outputs may be used by selecting suitable resistive elements 324 in the voltage divider 320.

Further, because the voltage divider 320 is applied between the outputs of the first bias generator 200 and the second bias generator 321, each of the output bias levels 202, 323, 325, and 326 may benefit from the same PVT tolerance resulting from the bias generator 200. That is, because the bias level outputs between the first bias level output NBias1X 202 and the second bias level output NBias40X 323 are interpolated by the voltage divider 320 from the first bias level output NBias1X 202 and the second bias level output NBias40X 323, they may still represent PVT tolerant voltage values.

Figure 13:
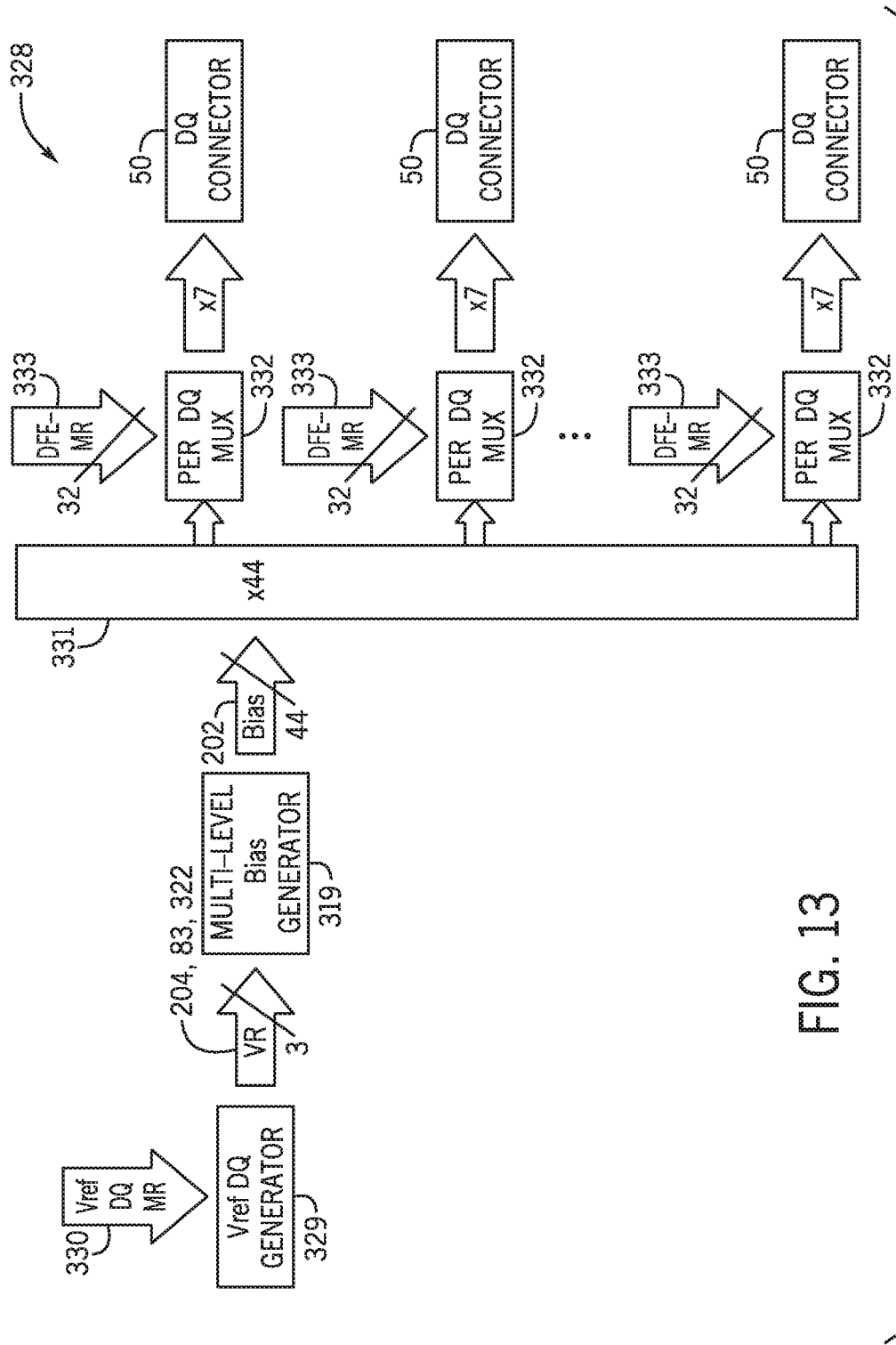
FIG. 13 illustrates a block diagram of a routing scheme which may deliver the outputs of the multi-level bias generator of FIG. 12 to suitable portions of the memory device, according to an embodiment of the present disclosure.

In some embodiments, once the bias level outputs (e.g., 202, 323, 325, and 326) are globally generated at runtime, the suitable bias levels may be locally distributed to regions of the memory device 10, such as a DQ connector 50. Accordingly, FIG. 13 illustrates an embodiment of a routing scheme 328 to deliver the suitable bias levels to each DQ connector 50 of each DQ receiver 62 of the memory device 10.

In such embodiments, the memory device 10 may contain a number of mode registers (MR) that may contain programmable values. In some embodiments, a user and/or the memory device 10 may instantiate the programmable values in the MRs. The programmable values may then, for example, be used to set a value of a signal used in the memory device 10. In some embodiments, for example, a first MR may contain a programmed value that may set DQ reference signal 83. As such, a VRefDQ generator 329 may receive an input signal (e.g., VRefDQ MR 330) from the first MR and may generate DQ reference signal 83 based on the input. The VRefDQ generator 329 may further generate the modified DQ reference signal 204 and the additional modified DQ reference signal 322 so that three reference signals (e.g., DQ reference signal 83, Modified DQ reference signal 204, and the additional modified DQ reference signal 322) may be input to the multi-level bias generator 200. That is, in some embodiments, the VRefDQ generator 329 may provide each of the reference inputs to the multi-level bias generator 200 based on an input signal (e.g., VRefDQ MR 330) received from a programmable MR. As such, programming and reprogramming of the MR may result in different input signals provided to the multi-level bias generator 200.

Further, as described with reference to FIG. 12, the multi-level bias generator 200 may use the inputs from the VRefDQ generator 329 to simultaneously generate the bias level outputs that may be used in the memory device 10. As such, the output of the multi-level bias generator 200 may include a number of bias level outputs (e.g., 41). The multi-level bias generator 200 may further output additional bias signals that may be utilized by the VGA 82, the DFE summer 85, and/or the like. For example, in some embodiments, the multi-level bias generator 200 may output bias signals such as DQ reference signal 83. In other embodiments, the multi-level bias generator 200 may additionally output the bias signals VNBiasVGA, and VNBiasSUM (not shown) that may be used by the VGA 82 and the DFE summer 85, respectively. In such embodiments, the VGA 82 and/or the DFE summer 85 may operate on a different reference signal (e.g., VNBiasVGA, and VNBiasSUM, respectively) than the common reference signal DQ reference signal 83. Further, in such embodiments, the multi-level bias generator 200 may generate a total of 3 bias levels in addition to the 41 bias level outputs. Thus, as the illustrated embodiment shows, a number (e.g., 44) of bias levels may collectively be output from the multi-level bias generator 200 to a signal routing block 331, such as a bus.

The routing block 331 may direct the signals to a number of multiplexers 332 (muxes). In some embodiments, the routing scheme may include a mux 332 for each DQ connector 50. Further, each mux 332 may receive each of the signals (e.g., 44 signals) that are output from the multi-level bias generator 200. As such, each mux 332 may select and locally deliver suitable bias levels from the multi-level bias generator 200 to a DQ connector 50 associated with it. To do so, in some embodiments, the mux 332 may receive a DFE-MR 333 input signal from an MR register as a select signal to determine the suitable bias levels. Thus, as will be described in further detail below, the mux 332 may receive a number (e.g., 32) of bits (e.g., DFE-MR 333) from an MR to select and output a number (e.g., 7) of suitable bias values for the associated DQ connector 50.

Figure 14:
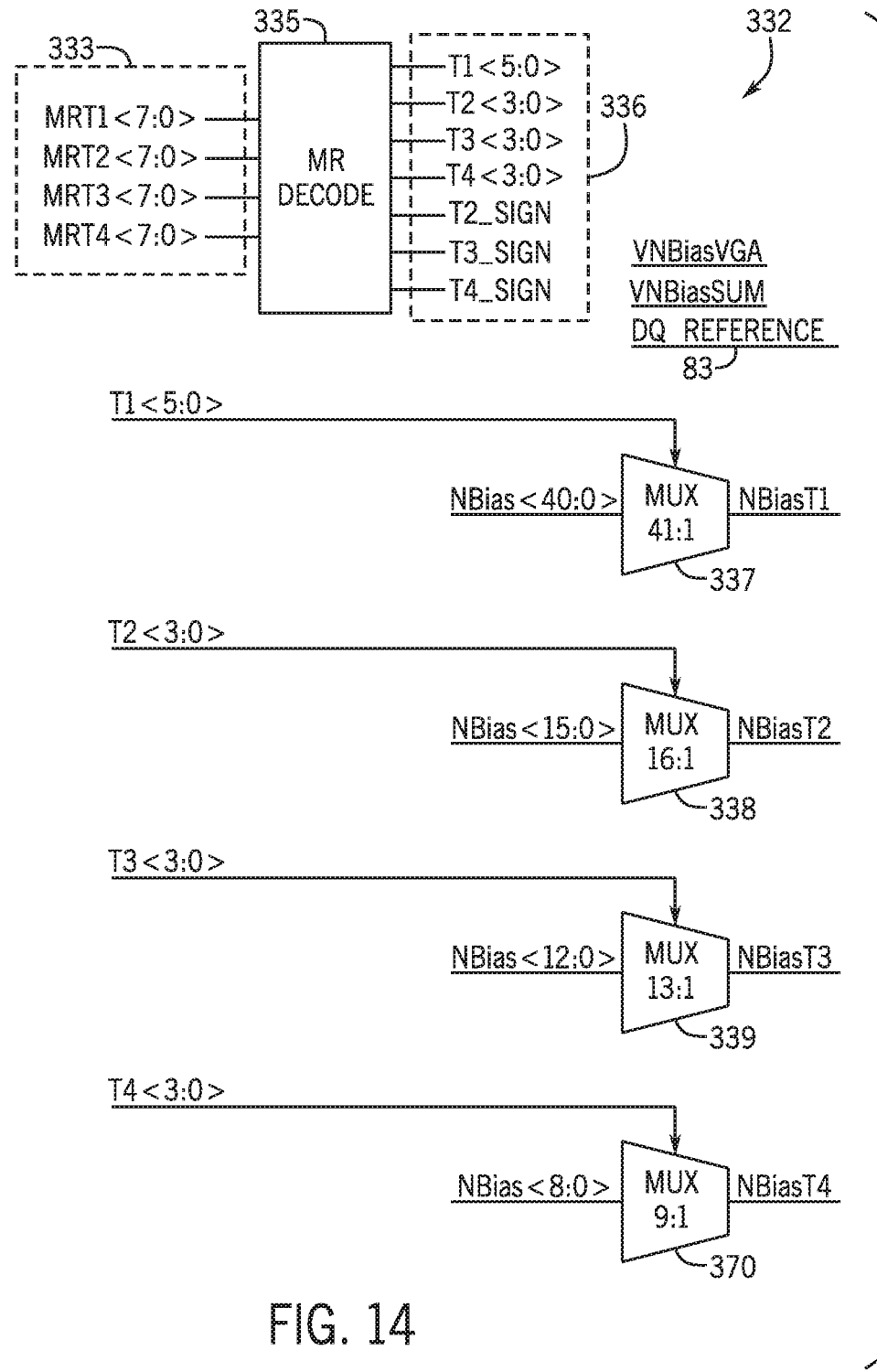
FIG. 14 illustrates a block diagram of a multiplexer of the routing scheme of FIG. 13, according to an embodiment of the present disclosure.

Turning now to FIG. 14, a more detailed embodiment of the mux 332 is provided. In some embodiments, the mux may receive the DFE-MR 333 signal at an MR decoder block 335. In such embodiments, the DFE-MR 333 signal may include a signal for each tap (e.g., MRT1<7:0> corresponding to a first tap, MRT2<7:0> corresponding to a second tap, MRT3<7:0> corresponding to a third tap, and MRT4<7:0> corresponding to a fourth tap) of the DFE 70 in the DQ receiver 62. In the illustrated embodiment, for example, the MR decoder block 335 may receive a 32-bit DFE-MR 333 signal that may include 8 bits of data for each tap in the 4-tap DFE 70. The MR decoder block 335 may then decode (e.g., translate) the DFE-MR signal 333 into a set of select signals 336, which may include a signal for each tap in the DFE 70.

Further, the mux 332 may include a number of sub-muxes 364. That is, in some embodiments, the multiplexing functionality of the mux 332 may be divided among a set of sub-muxes 364. As such, the mux 332 may include a sub-mux 364 for each tap included in the DFE 70. In some embodiments, each of the sub-muxes 364 may receive a number of bias levels generated by the DFE bias generator 200 and routed through the routing block 331 as inputs. The sub-muxes 364 may further include an input select signal, which may be received from a select signal 336 corresponding to the same tap as the sub-mux 364. As such, each sub-mux 364 may select and output a single suitable bias level for a corresponding tap, according to the globally available bias levels generated by the DFE bias generator 200 and the select signal 336 decoded from the DFE-MR signal 333.

Because the contribution of each tap in the DFE 70 may depend on the distortion caused by the previously received data and, as discussed, because the most recent previously received data (e.g., bit n−1) may have a stronger contribution to the distortion of the received data (e.g., distorted bit n) than bits received at earlier times (e.g., bits n−1, n−2, and n−3), a suitable bias level range for the first tap may be wider than the range for a later tap, such as the fourth tap. That is, greater correction may be applied, using a higher bias level, to the first tap than a later tap. As such, the first sub-mux 337 may receive the entire range of bias levels generated by the DFE bias generator, excluding the additional bias values (e.g., DQ reference signal 83, VNBiasVGA, and VNBias-SUM). That is, in the illustrated embodiment, the first sub-mux 337 may receive NBias<40:0> (e.g., 41 inputs) as an input. In such embodiments, to select between the inputs, the select signal 336 corresponding to the first tap (e.g., T1<5:0>) may include a suitable number of bits (e.g., 6) to so that a unique coding may be mapped to and/or used for selecting an output bias level from the input bias levels. That is, a select signal 336 with 6 bits, for example, may encode 64 different values, and as such, the first sub-mux 337 may have a different 6-bit coding for each of the 41 inputs (e.g., NBias<40:0>) in the illustrated embodiment so that a different select signal 336 may correspond to each of the inputs. In contrast, the second sub-mux 338 may receive fewer inputs (e.g., NBias<15:0>), as the suitable bias level range for the second tap may be narrower than that of the first tap. That is, the DFE 70 may apply less correction to the second tap than the first tap, as bit n−2 may apply less distortion to the received data than the most recent previously received data (e.g., bit n−1). Accordingly, in some embodiments, the third sub-mux 339 may receive even fewer inputs (e.g., NBias<12:0>), and the fourth sub-mux 340 may receive the fewest inputs (e.g., NBias<8:0>). In such embodiments, the sub-muxes receiving fewer inputs than the first sub-mux 337 (e.g., the second sub-mux 338, the third sub-mux 339, and the fourth sub-mux 340) may receive a smaller select signal 336, as fewer bits may identify the reduced number of input options. In the illustrated embodiment, for example, a 4-bit select signal 336 (e.g., T2<3:0>) is used to select an output from the 16 options (e.g., NBias<15:0>) available to the second sub-mux 338.

Accordingly, in the illustrated embodiment, each of the sub-muxes 364 are labeled to denote the number of inputs the sub-mux 364 is equipped to receive and the number of outputs the sub-mux 364 is equipped to select. For example, the first sub-mux 337 may receive 41 inputs (e.g., NBias<40:0>) and may select a single output (e.g., NBiasT1). As such, in the illustrated embodiment, the first sub-mux 337 is labeled 41:1 to reflect the 41 inputs and single output.

Thus, each of the sub-muxes 364 (e.g., 337, 338, 339, and 340) may receive a number bias levels as inputs (e.g., NBias<40:0>, NBias<15:0>, NBias<12:0>, and NBias<8:0>, respectively) and may select an output bias level (e.g., NBiasT1, NBiasT2, NBiasT3, and NBiasT4, respectively) based on a suitably sized select signal 336 (e.g., T1<5:0>, T2<3:0>, T3<3:0>, and T4<3:0>, respectively). To that end, the mux 332 may output each of the output bias levels (e.g., NBiasT1, NBiasT2, NBiasT3, and NBiasT4) generated by the sub-muxes 364 (e.g., 337, 338, 339, and 340 respectively) to a DQ connector 50, as illustrated in FIG. 13. The mux 332 may further output the additional bias levels (e.g., VNBiasVGA, VNBiasSUM, and DQ reference signal 83) so that, in the illustrated embodiment, the DQ connector 50 may receive 7 input signals (e.g., an input bias level for each of 4 taps in the DFE 70 and the set of three bias levels).

In some embodiments, the mux 332 may operate in the voltage domain. As such, the bias levels generated by the DFE bias generator 200 and input into the mux 332 (e.g., NBias<40:0>) may represent voltages. Further, the selected bias levels output by the mux 332 (e.g., NBiasT1, NBiasT2, NBiasT3, NBiasT4) may represent voltages. As such, in such embodiments, the mux 332 and/or other portions of the routing scheme of FIG. 13 may include decoupling capacitance to reduce noise in the bias levels as they are generated, routed, and selected. Further, the decoupling capacitance may result in a low current load on the routing scheme, as the NBias 202 levels may not draw current. Working in the voltage domain may further allow the mux 332 to function on a high impedance node. As such, the mux 332 may switch (e.g., select) an output bias level with little charging and/or discharging time. Thus, the mux 332 may have little time penalty (e.g., delay) to switch between bias levels.

Figure 15:
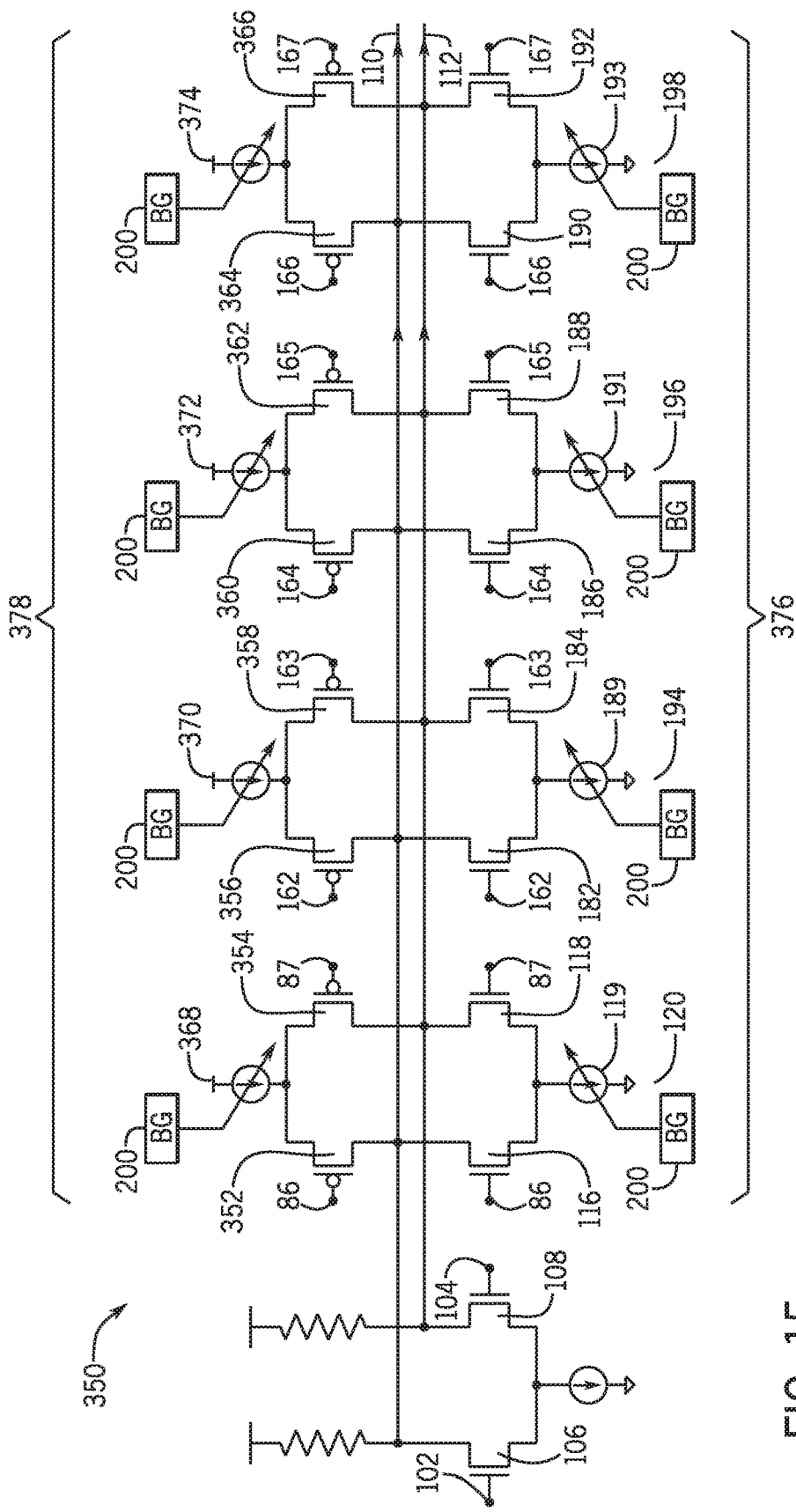
FIG. 15 illustrates a second circuit diagram of a portion of the DFE of FIG. 7, according to an embodiment of the present disclosure.

In some embodiments, tap corrections in conjunction with the summer circuits 85 described above utilize differential pairs of transistors that create imbalance in the summer proportional to a set value. The imbalance may be, for example, created by a pulldown transistor enabled on only one side of the differential pair of transistors based on the sign of correction required. However, in some embodiments, as the common-mode signal (e.g., a common-mode current) of the summer circuits 85 changes across operation conditions, the impact of the analog value set by the respective a controllable sources (e.g., the current sources controlled by the DACs 121, 195, 197, and 199) may not remain constant i.e. the tap response from the summer circuit 85 becomes non-linear. Accordingly, in some embodiments, a push-pull summer approach that adds and subtracts current in predetermined amounts (e.g., in equal measure) may be utilized to maintain a consistent average common-mode signal, which allows the tap response to be much more linear. For example, as illustrated in FIG. 15, a push-pull summer 350 (e.g., a push-pull summation circuit) may be utilized to accomplish DFE correction. The push-pull summer 350 includes pull circuitry 376 and push circuitry 378 to add and subtract current from the summer in order to maintain a constant average common-mode signal. In some embodiments, the push-pull summer 350 may subtract current in equal amounts, however it might also be useful to subtract in unequal amounts if that results in a more linear tap response.

Accordingly, FIG. 15 illustrates a circuit diagram of a portion of the DFE 70 of FIG. 7 that may negate distortions via use of the push-pull summer 350 in place of summer circuit 85. The push-pull summer 350 contains pull circuitry 376 and push circuitry 378. The pull circuitry 376 operates generally similarly to what was described above with respect to FIG. 8. However, the push-pull summer 350 utilizes both of the pull circuitry 376 and push circuitry 378 to adjust current in predetermined amounts (e.g., in equal measure) and may be utilized to maintain a consistent average common-mode signal, which allows the tap response to be much more linear. A DFE 70 having the push-pull summer 350 of FIG. 15 may receive a logical high or low for the n−1 bit, the n−2 bit, the n−3 bit, or the n−4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, 167 as control signals for the field effect transistors 116, 118, 182, 184, 186, 188, 190, 192 as well as for the control signals for the field effect transistors 352, 354, 356, 358, 360, 362, 364, and 366 to control outputs therefrom transmitted to the outputs 110, 112. Field effect transistors 182, 184, 186, 188, 190, and 192 are part of the pull circuitry 376, while field effect transistors 352, 354, 356, 358, 360, 362, 364, and 366 are part of the push circuitry 378. The field effect transistors 182, 184, 186, 188, 190, 192, 352, 354, 356, 358, 360, 362, 364, and 366 of the push-pull summer 350 may be selectively and controllably activated to reflect one of the sixteen (e.g., $2^4$) different possible binary states represented by the various combinations of previously corrected bits (e.g., 0000, 0001, 0010 . . . 1111).

The weighted taps 86, 87, 162, 163, 164, 166 and 167 values may be applied to the outputs 110 and 112, whereby the current supplied is controlled through the controllable source 120 and additional controllable sources 194, 196, 198, 368, 370, 372, and 374 (e.g., a current source controlled by a respective bias generator 200). Alternatively, each bias generator 200 could be replaced by a DAC, such as any one of DAC 121, 195, 197, and 199 of FIG. 8. The outputs 110 and 112 may be transmitted to a data latch, such as data latch 94. The controllable sources 368 and 120 may both supply current to the same weighted taps 86 and 87, however this may be supplied through different circuits (i.e., 120 supplies current to the pull circuitry 376 and 368 supplies current to the push circuitry 378), whereby the supplied currents may have equal or unequal values depending on the linear response of the DFE 70. The push-pull summer 350 may operate to add and subtract the supplied currents in equal measure from the differential nodes (e.g., the connection points with the outputs 110 and 112 of the pull circuitry 376 and push circuitry 378) in order to maintain constant average common-mode signal. This may allow for the various tap responses to have improved linearity.

For example, if the pull circuitry 376 operates alone (e.g., if the push circuitry 378 is not present), the DFE 70 may operate as described generally with respect to FIG. 8. That is, weighted tap 86 and its inverse value (e.g., inverse weighted tap 87) may be transmitted to the outputs 110 and 112 to correct the distortion in the distorted bit 81. A logical high for the n−1 bit is transmitted through the path 72. In this case, the n−1 bit may be implemented to generate the weighted tap 86 and the inverse weighted tap 87 as a control signal for two field effect transistors 116 and 118 enabling the contribution of the weighted tap values 86 and 87 to the outputs 110 and 112. For example, if the correction due to the n−1 bit is, for example, 50 mV, if the pull circuitry 376 operates alone (e.g., if the push circuitry 378 is not present), all of the correction to be applied with respect to weighted tap 86 and its inverse value (e.g., inverse weighted tap 87) comes from the differential pair of field effect transistors 116 and 118. However, by using the pull circuitry 376 in conjunction with the push circuitry 378, if the correction due to the n−1 bit is, for example, 50 mV, the pull circuitry 376 may operate to effect 25 mV of correction to be applied from the differential pair of field effect transistors 116 and 118 and 25 mV of correction to be applied from the differential pair of field effect transistors 352 and 354.

Additionally, non-equal values may instead be applied in pull circuitry 376 in conjunction with the push circuitry 378. For example, a 25% correction may be applied from a differential pair of field effect transistors in the pull circuitry 376 and a 75% correction may be applied from a differential pair of field effect transistors in the push circuitry 378 corresponding to the differential pair of field effect transistors in the pull circuitry 376, a 20% correction may be applied from a differential pair of field effect transistors in the pull circuitry 376 and a 80% correction may be applied from a differential pair of field effect transistors in the push circuitry 378 corresponding to the differential pair of field effect transistors in the pull circuitry 376, a 75% correction may be applied from a differential pair of field effect transistors in the pull circuitry 376 and a 25% correction may be applied from a differential pair of field effect transistors in the push circuitry 378 corresponding to the differential pair of field effect transistors in the pull circuitry 376, a 80% correction may be applied from a differential pair of field effect transistors in the pull circuitry 376 and a 20% correction may be applied from a differential pair of field effect transistors in the push circuitry 378 corresponding to the differential pair of field effect transistors in the pull circuitry 376, or additional ratios may be utilized as desired to maintain consistency of the common-mode signal generated by the DFE 70. Similarly, equal ratio or differing ratio values for currents may be applied to controllable sources 194 and 370, controllable sources 196 and 372, and controllable sources 198 and 374. The corrected bit 88 may be generated via the data latch 94 based upon the outputs 110 and 112 and may be transmitted to the deserializer 66 on the rising edge of the DQS signal 96. The n−1 bit, the n−2 bit, the n−3 bit, and the n−4 bit information stored for transmission along the paths 72, 74, 76, and 78 in the deserializer 66 may be updated with the corrected bit 88 (e.g., n−4 bit will update to reflect n−3 data, n−3 bit will update to reflect n−2 data, n−2 data will update to reflect n−1 data, and n−1 data will update with the newly corrected bit) for future distortion corrections.

The bias generators 200 may supply PVT tolerant outputs to control the controllable sources (e.g., controllable sources 120, 194, 196, 198, 368, 370, 372, and 374) in the push-pull summer 350. Further, because the push-pull summer may incorporate pull circuitry 376 and push circuitry 378, the control of a controllable source in the pull circuitry 376 may coordinate with a control of a corresponding controllable source in the push circuitry 378 in order to set a suitable correction contribution from each controllable source. That is for example, a control for the controllable source 120 may coordinate with a control of the controllable source 368 so that the pull circuitry 376 and the push circuitry 378 may each apply a suitable correction to the distorted bit 81. As such, in some embodiments, a mirrored-output bias generator 400 in place of the bias generators 200 or DACs such as DAC 121 may be used to generate PVT tolerant outputs to suitably adjust a corresponding pair of controllable sources (e.g., controllable source 120 and controllable source 368) in the pull circuitry 376 and push circuitry 378.

Figure 16:
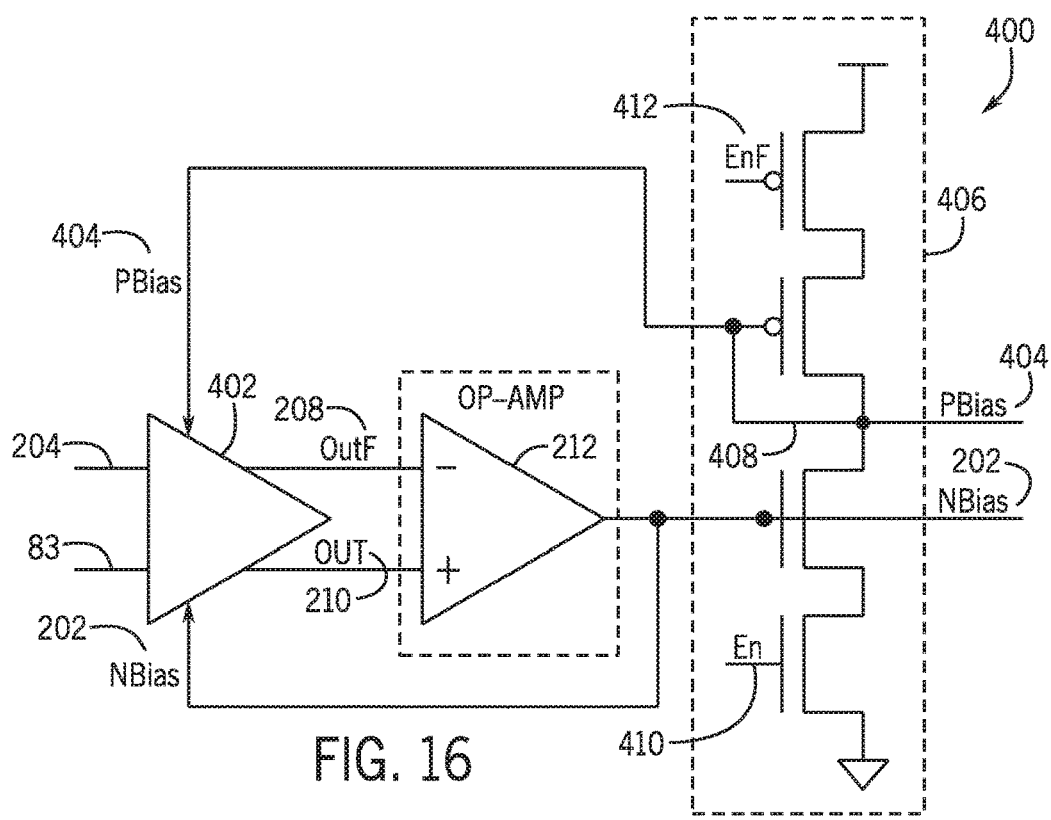
FIG. 16 illustrates a second embodiment of an embodiment of a bias generator, according to an embodiment of the present disclosure.

Turning to FIG. 16, the mirrored-output bias generator 400 may include a pair of mirrored output bias levels (e.g., bias level NBias 202 and bias level PBias 404) that may mirror each other. That is, in some embodiments, bias level PBias 404 may represent a bias level suitable to cause a P-type metal-oxide-semiconductor field effect transistor (PMOS) to generate the same amount of current (e.g., 10 microamperes) that the mirrored bias level NBias 202 may cause an N-type metal-oxide-semiconductor field effect transistor (NMOS) to generate. The mirrored bias levels (e.g., bias level NBias 202 and bias level PBias 404) may thus control a controllable source in the pull circuitry 376 and the push circuitry 378, respectively, of the push-pull summer 350. Thus, the mirrored-output bias generator 400 may generate PVT tolerant outputs (e.g., bias level NBias 202 and bias level PBias 404) that may cause a pair of controllable sources across push circuitry 378 and pull-circuitry 376 in a push-pull summer 350 (e.g., controllable source 120 and controllable source 368) to effect suitable correction to the output signals 110 and 112.

In order to generate the mirrored bias levels (e.g., bias level NBias 202 and bias level PBias 404), the mirrored-output bias generator 400 may contain additional structures and connectivity when compared to the bias generator 200 of FIG. 9. In some embodiments, for example, the op-amp 212 of mirrored-output bias generator 400 may connect to a current mirror 406 instead of directly outputting to the controllable source 120. The current mirror 406 may receive the bias level NBias 202 as an input and output the equivalent bias level signal for a PMOS (e.g., PBias 404) from a diode connected field effect transistor 408. The current mirror 406 may also receive enable signals (e.g., En 410 and EnF 412) as inputs to activate (e.g., enable) the current mirror 406. In some embodiments, the enable signals (e.g., En 410 and EnF 412) may be set to maintain the current mirror 406 in an active state while the DQ receiver 62 is powered on. That is, the current mirror 406 may continue to function while the circuits within the DQ receiver 62 receive power.

Further, in some embodiments, the bias level PBias 404 generated by the current mirror 406 may feedback into a receiver 402. As such, in addition to receiving the DQ reference signal 83 and the modified DQ reference signal 204 as inputs, the receiver 402 may receive two feedback signals (e.g., bias level NBias 202 and bias level PBias 404). Thus, though the receiver 402 may output Out 210 and OutF 208 to the op-amp 212, the receiver 402 may generate its outputs (e.g., Out 210 and OutF 208) in a different manner than receiver 206 in order to handle the bias level PBias 404 feedback signal, in addition to the bias level NBias 202 feedback signal.

Figure 17:
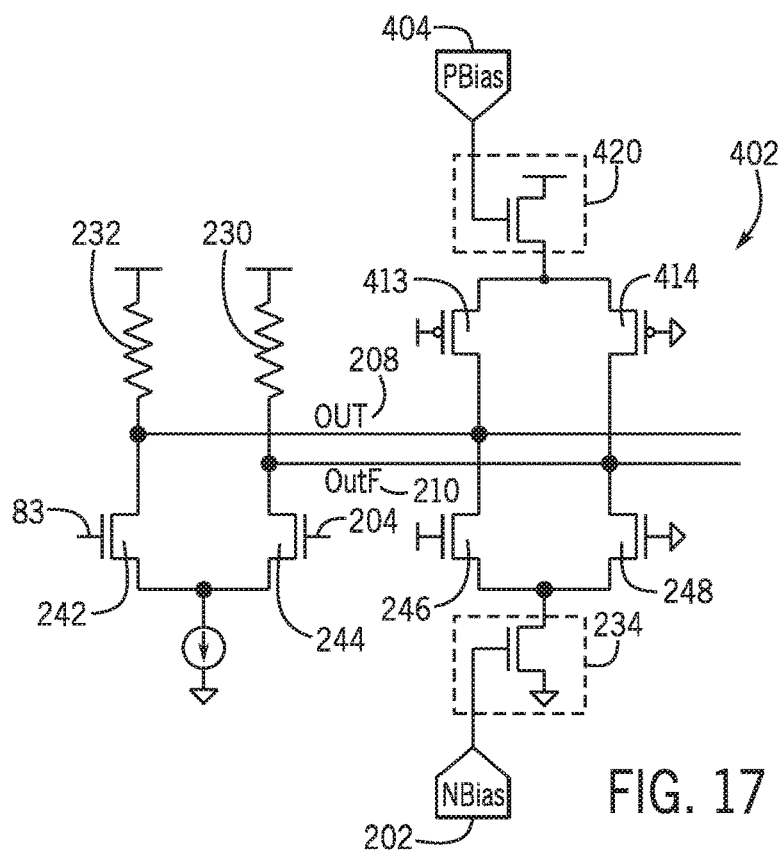
FIG. 17 illustrates an embodiment of a receiver of the bias generator of FIG. 14, according to an embodiment of the present disclosure.

Turning now to FIG. 17, an embodiment of the receiver 402 may be illustrated. The receiver 402 may include the components of the receiver 206 with an additional controllable source 420 coupled to an additional pair of field effect transistors 413 and 414 that may apply current to the outputs Out 210 and OutF 208 in combination with the current applied by the controllable source 234 and the pair of field effect transistors 246 and 248. Further, the operation of the receiver 402 may resemble that of the receiver 206. While receiver 206 may modulate an output signal (e.g., Out 210) of the input signal (e.g., the DQ reference signal 83) according to the value of bias level NBias 202, the receiver 402 may modulate the values of both Out 210 and OutF 208, according to both bias level NBias 202 and bias level PBias 404. In some embodiments, for example, because the modified DQ reference signal 204 is greater than the DQ reference signal (e.g., by X mV) the output OutF 208 corresponding to the modified DQ reference signal 204 may be higher than Out 210. With the additional controllable source 420 coupled to the additional pair of field effect transistors 413 and 414 included in the structure of the receiver 402, additionally or in the alternative of using the resistive load 232 to pull up the value of Out 210, the bias level PBias 404 may drive the additional controllable source 420 to bring the value of OutF 208 down (e.g., lower) closer to Out 210. In the case that the value of Out 210 is greater than the value of OutF 204, the controllable source 234 may pull Out 210 down (e.g., lower) to bring its value closer to OutF 204. Additionally or alternatively, the resistive load 230 may pull OutF 210 up (e.g., higher) to bring its value closer to Out 210. The resulting values of Out 210 and OutF 208 may then be fed into the op-amp 212, as illustrated in FIG. 16, and the most recent difference between Out 210 and OutF 208 may be used to calculate a resulting bias level NBias 202 value, according to the same method used in the receiver 206.

Thus, a method to generate the mirrored bias levels of bias level NBias 202 and bias level PBias 404 with the mirrored-output bias generator 400 may generally follow the method 300 that may generate bias level NBias 202 from the bias generator 200. That is, each of the blocks and/or paths (e.g., 302, 304, 306, 308, 310, 314, and 316) in the illustrated embodiment of the method 300 in FIG. 11 may be performed with slight modifications in the method to generate the mirrored bias levels (e.g., bias level NBias 202 and bias level PBias 404). That is, in place of exclusively using bias level NBias 202 as a feedback value for the receiver 206 to calculate Out 210 and OutF 208 at block 302, both bias level NBias 202 and bias level PBias 404 may be used by the receiver 402 to calculate Out 210 and OutF 208. Further, after bias level NBias 202 is generated at block 308, the current mirror 406 may generate its mirrored signal, bias level PBias 404. Bias level PBias 404 may feedback to the receiver 402 and/or control a controllable source (e.g., controllable source 368) in the push circuitry 378 of the push-pull summer 350, based on the comparison of Out 210 and OutF 208, as described in block 310 and block 312. Bias level NBias 202 may also feedback to receiver 402 and/or control a controllable source (e.g., controllable source 120) in the pull circuitry 376 of the push-pull summer 350, as described in block 314. Thus, using the bias level NBias 202 and bias level PBias 404 as feedback in its receiver 402, the mirrored-output bias generator 400 may generate PVT tolerant outputs (e.g., bias level NBias 202 and bias level PBias 404) that may cause a pair of controllable sources across push circuitry 378 and pull-circuitry 376 in a push-pull summer 350 (e.g., controllable source 120 and controllable source 368) to effect suitable correction to the output signals 110 and 112.

Further, as described above with reference to FIG. 12 the memory device 10 may utilize multiple bias level outputs. As such, memory devices 10 that may benefit from the generation of mirrored output bias levels (e.g., that utilize the mirrored-output bias generator 400) may utilize multiple different mirrored output bias levels. Thus, while the embodiments described herein may depict the local generation of mirrored bias levels (e.g., bias level NBias 202 and bias level PBias 404) for a push-pull summer 350 for a DFE 70 receiving a single data IO signal (e.g., an individual DQ connector 50), in some embodiments, each data IO signal of the memory device 10 may benefit from correction.

As such, to efficiently generate the necessary mirrored bias values for use across different taps in a DFE summer 85 and/or across different data IO signals, the memory device 10 may include systems and methods to globally generate mirrored bias levels. That is, instead of or in addition to locally generating different mirrored bias levels for each data IO signal at runtime based on programmed values and/or user input, the memory device 10 may include a number of different generated mirrored bias levels that are simultaneously available globally (e.g., to all of the necessary regions of the memory device 10) to be selected at runtime.

Figure 18:
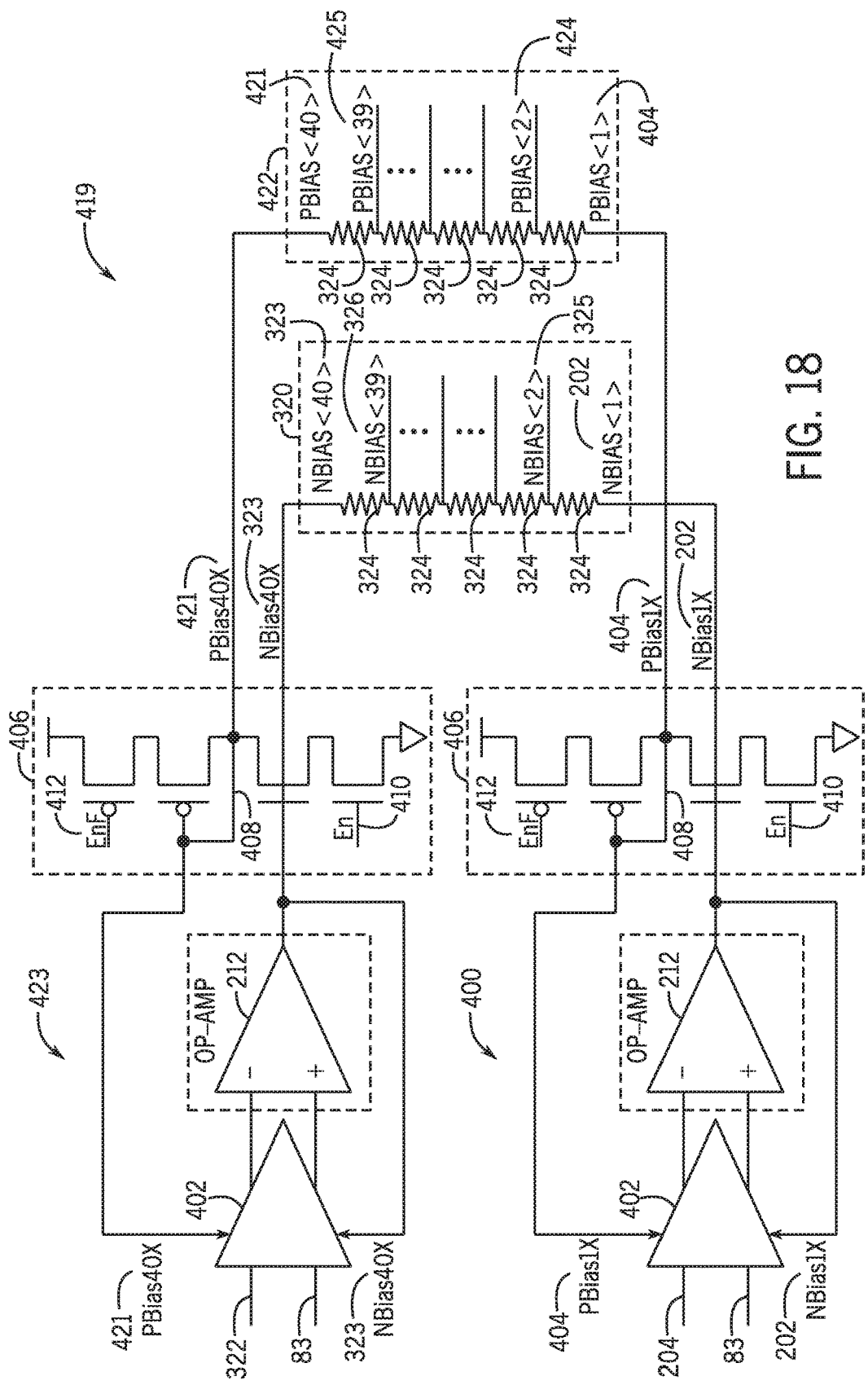
FIG. 18 illustrates a block diagram of a second embodiment of a multi-level bias generator, according to an embodiment of the present disclosure.

Accordingly, FIG. 18 illustrates an embodiment of a multi-level mirrored bias generator 419 capable of simultaneously generating a plurality of mirrored bias levels. In some embodiments, the multi-level mirrored-output bias generator 419 may include a voltage divider 320 coupled between the outputs (e.g., NBias1X 202 and NBias40X 323) of a set of two or more mirrored-output bias generators (e.g., 400 and 423) and a second voltage divider 422 coupled between the mirrored outputs (e.g., PBias1X 404 and PBias40X 421) of the mirrored-output bias generators (e.g., 400 and 423). In such embodiments, a first mirrored-output bias generator 400 may receive DQ reference signal 83 and modified DQ reference signal 204 as inputs, while a second mirrored-output bias generator 423 may receive DQ reference signal 83 and additional modified DQ reference signal 322 as inputs. The modified DQ reference signal 204 may represent a correction factor X (e.g., 1X) added to the DQ reference signal 83, where the correction factor X may represent a non-zero value that may indicate the smallest meaningful (e.g., detectibly impacting an output) step size between DQ reference signal 83 and modified DQ reference signal 204 for a bias generator 200. Further, the additional modified DQ reference signal 322 may represent 40X (e.g., 40*X) added to the DQ reference signal 83, where 40X may represent the maximum step size between the DQ reference signal 83 and the additional modified DQ reference signal 322 that is meaningful to (e.g., influences) the bias generator 200. Thus, the inputs to the first mirrored-output bias generator 400 and the second mirrored-output bias generator 423 may represent boundary conditions handled by a mirrored-output bias generator 400 (e.g., modified DQ reference signal 204 and additional modified DQ reference signal 322, respectively). As a result of the boundary conditions applied at the input of the first mirrored-output bias generator 400 and the second mirrored-output bias generator 423, the output NBias1X 202 and the mirrored output PBias1X 404 of the mirrored bias generator 400 may represent output bias levels in response to inputs on the low end of the first mirrored bias generator's 400 operating conditions, while the output NBias40X 323 and the mirrored output PBias40X 421 of the second bias generator 164B may represent output bias levels in response to inputs on the high end of the second mirrored-output bias generator's 423 operating conditions. As such, a range of possible bias level outputs and equal mirrored outputs from a mirrored-output bias generator 400 may exist between NBias1X 202 and NBias40X 323 and between PBias1X 404 and PBias40X 421, respectively.

In some embodiments, the voltage divider 320 may include a number of resistive elements 324 (e.g., resistors, capacitors, inductors, or any suitable combination thereof) that may divide the first bias level output NBias1X 202 and the second bias level output NBias40X 323 into a number of different bias level outputs (e.g., 325-326). That is, the voltage divider 320 may interpolate a number of bias level outputs between the first bias level output NBias1X 202 and the second bias level output NBias40X 323. More specifically, in some embodiments, the voltage divider 320 may interpolate a bias level output corresponding to each bias generator 164 input value from modified DQ reference signal 204 to additional modified DQ reference signal, with a step size of X (e.g., 40 different bias level outputs). Further, the second voltage divider 422 may perform the same functions as the voltage divider 320 on the mirrored bias level outputs (e.g., 424-425). That is, the second voltage divider may interpolate the first mirrored bias level output PBias1X 404 and the second bias level output PBias40X 421 into a number of different bias level outputs (e.g., 424-425).

The bias level outputs (e.g., 202, 323, 325, and 326) and mirrored-bias level outputs (e.g., 404, 424, 425, and 426) may be output directly from a mirrored-output bias generator (e.g., 400 or 423) or output between a set of resistive elements 324 (e.g., resistors). As such, the resistance applied by resistive elements 324 may determine the level of each of the bias level outputs (e.g., 202, 323, 325, and 326) and mirrored-bias level outputs (e.g., 404, 424, 425, and 426). Further, the resistive contribution of each of the resistive elements 324 in the voltage divider 320 and the second voltage divider 422 may determine the relationship between bias level outputs (e.g., 202, 323, 325, and 326) and between and mirrored-bias level outputs (e.g., 404, 424, 425, and 426), respectively. For example, a voltage divider 320 with a number of resistors each with suitable resistance may generate bias level outputs that are linearly related.

In some embodiments, because the bias level outputs (e.g., 202, 323, 325, and 326) and mirrored-bias level outputs (e.g., 404, 424, 425, and 426) may control the set of controllable sources 120, 194, 196, and 198 across and the pull circuitry 376 and the set of controllable sources 368, 370, 372, and 374 across the push circuitry 378 of the push-pull summer 350 which, in turn, impacts the outputs 110 and 112, an inverse square relationship between consecutively generated bias level outputs and between consecutively generated mirrored-bias level outputs may be desirable. That is, because the current supplied by field effect transistors (e.g., 116 and 118) adjusts based on a square function of the voltage supplied to a current source (e.g., current source 119), the bias level outputs and mirrored-bias level outputs may be generated based on an inverse square function to linearize the adjustments made to the current supplied to the outputs 110 and 112 between bias level outputs and between mirrored-bias level outputs, respectively. In other embodiments, however, a linear or any other suitable relationship between bias level outputs and between mirrored-bias level outputs may be used by selecting suitable resistance elements 324 in the voltage divider 320 and in the second voltage divider 422, respectively.

Further, because the voltage divider 320 is applied between the outputs of the first mirrored-output bias generator 400 and the second bias generator 423, each of the output bias levels (e.g., 202, 323, 325, and 326) may benefit from the same PVT tolerance resulting from the mirrored-output bias generator 400. That is, because the bias level outputs between the first bias level output NBias1X 202 and the second bias level output NBias40X 323 are interpolated by the voltage divider 320 from the first bias level output NBias1X 202 and the second bias level output NBias40X 323, they still represent PVT tolerant voltage values. Accordingly, the second voltage divider 422 may be used to afford the same PVT tolerance to each of the interpolated mirrored-bias level outputs (e.g., 424-425) that the mirrored-bias level outputs (e.g., PBias1X 404 and PBias40X 421) generated directly from the mirrored-output bias generators 400 and 423 may have.

Figure 19:
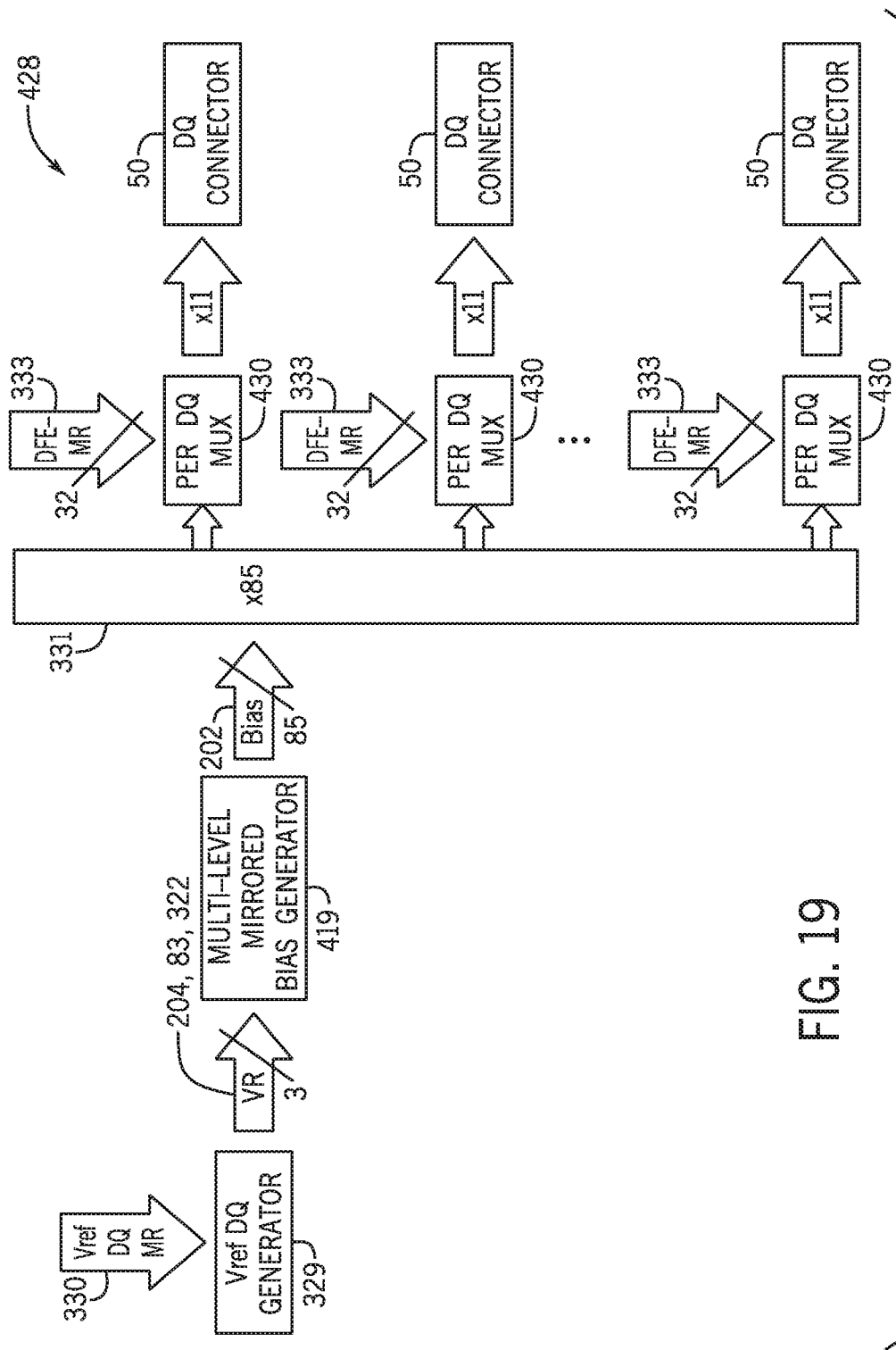
FIG. 19 illustrates a second embodiment of the block diagram of a routing scheme of FIG. 14, according to an embodiment of the present disclosure.

In some embodiments, once the mirrored-bias level outputs are globally generated at runtime, the suitable mirrored-bias level outputs may be locally distributed to regions of the memory device 10, such as a DQ connector 50. Accordingly, FIG. 19 illustrates an embodiment of an additional routing scheme 428 to deliver the suitable mirrored-bias level outputs to each DQ connector 50 of each DQ receiver 62 of the memory device 10.

In such embodiments, the memory device 10 may contain a number of MRs that may contain programmable values. In some embodiments, a user and/or the memory device 10 may instantiate the programmable values in the MRs. The programmable values may then, for example, be used to set a value of a signal used in the memory device 10. In some embodiments, for example, a first MR may contain a programmed value that may set DQ reference signal 83. As such, a VRefDQ generator 329 may receive an input signal (e.g., VRefDQ MR 330) from the first MR and may generate a DQ reference signal 83 based on the input. The VRefDQ generator 329 may further generate the modified DQ reference signal 204 signal and the additional modified DQ reference signal 322 so that three reference signals (e.g., DQ reference signal 83, modified DQ reference signal 204, and the additional modified DQ reference signal 322) may be input to the multi-level mirrored-voltage bias generator 400. That is, in some embodiments, the VRefDQ generator 329 may provide each of the reference inputs to the multi-level mirrored-voltage bias generator 400 based on an input signal (e.g., VRefDQ MR 330) received from a programmable MR. As such, programming and reprogramming of the MR may result in different input signals provided to the multi-level mirrored-voltage bias generator 400.

Further, as described with reference to FIG. 18, the multi-level mirrored-voltage bias generator 400 may use the inputs from the VRefDQ generator 329 to simultaneously generate the mirrored-voltage bias level outputs that may be used in the memory device 10. As such, the output of the multi-level mirrored-voltage bias generator 400 may include a number of mirrored-voltage bias level outputs (e.g., 82). This number may represent a sum of NBias 202 and PBias 404 levels output by the multi-level mirrored-voltage bias generator 400 (e.g., 41 NBias 202 levels and 41 PBias 404 levels). The multi-level mirrored-voltage bias generator 400 may further output additional bias signals that may be utilized by the VGA 82, the DFE summer 85, and/or the like. For example, in some embodiments, the multi-level mirrored-voltage bias generator 400 may output bias signals such as DQ reference signal 83. In other embodiments, the multi-level mirrored-voltage bias generator 400 may additionally output the bias signals VNBiasVGA, and VNBias-SUM (not shown) that may be used by the VGA 82 and the DFE summer 85, respectively. In such embodiments, the VGA 82 and/or the DFE summer 85 may operate on a different reference signal (e.g., VNBiasVGA, and VNBias-SUM, respectively) than the common reference signal DQ reference signal 83. Further, in such embodiments, the multi-level mirrored-voltage bias generator 400 may generate a total of 3 bias levels in addition to the 82 mirrored-voltage bias level outputs. Thus, as the illustrated embodiment shows, a number (e.g., 85) of bias levels may collectively be output from the multi-level mirrored-voltage bias generator 400 to a signal routing block 331, such as a bus.

The routing block 331 may direct the signals to a number of multiplexers 430 (muxes). In some embodiments, the routing scheme may include a mux 430 for each DQ connector 50. Further, each mux 430 may receive each of the signals (e.g., 85 signals) that are output from the multi-level mirrored-voltage bias generator 400. As such, each mux 430 may select and locally deliver suitable mirrored-voltage bias levels from the multi-level mirrored-voltage bias generator 400 to a DQ connector 50 associated with it. To do so, in some embodiments, the mux 430 may receive a DFE-MR 333 input signal from an MR register as a select signal to determine the suitable bias levels. Thus, as will be described in further detail below, the mux 430 may receive a number (e.g., 32) of bits (e.g., DFE-MR 333) from an MR to select and output a number (e.g., 7) of suitable mirrored-voltage bias values for the associated DQ connector 50.

Figure 20:
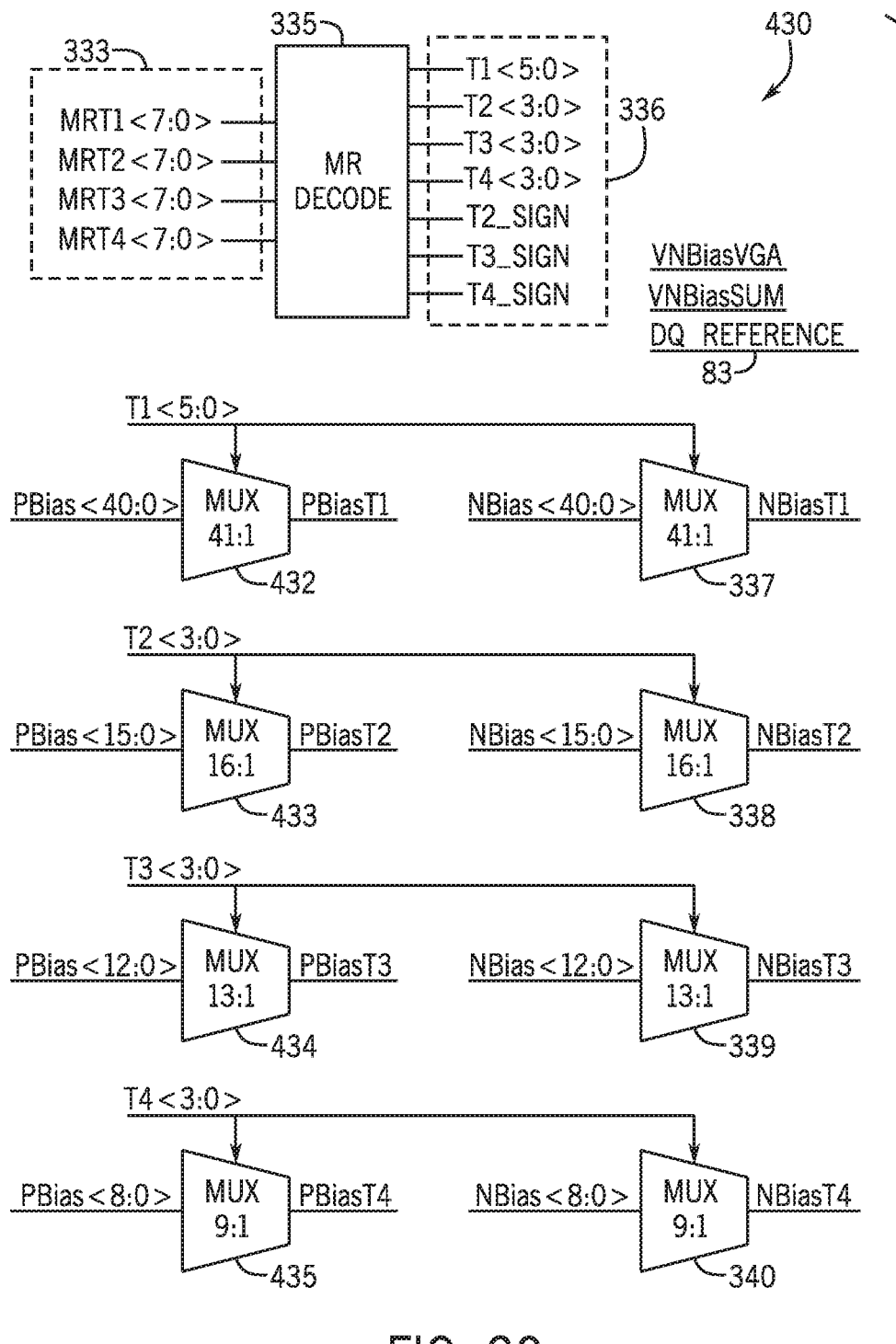
FIG. 20 illustrates a block diagram of the multiplexer of the routing scheme of FIG. 19, according to an embodiment of the present disclosure.

Turning now to FIG. 20, a more detailed embodiment of the mux 430 is provided. In some embodiments, the mux 430 may receive the DFE-MR 333 signal at an MR decoder block 335. In such embodiments, the DFE-MR 333 signal may include a signal for each tap (e.g., MRT1<7:0> corresponding to a first tap, MRT2<7:0> corresponding to a second tap, MRT3<7:0> corresponding to a third tap, and MRT4<7:0> corresponding to a fourth tap) of the DFE 70 in the DQ receiver 62. In the illustrated embodiment, for example, the MR decoder block 335 may receive a 32-bit DFE-MR 333 signal that may include 8 bits of data for each tap in the 4-tap DFE 70. The MR decoder block 335 may then decode (e.g., translate) the DFE-MR signal 333 into a set of select signals 336, which may include a signal for each tap in the DFE 70.

Further, the mux 430 may include a number of sub-muxes 364. That is, in some embodiments, the multiplexing functionality of the mux 430 may be divided among a set of sub-muxes 364. As the mux 430 may select both the NBias 202 and PBias 404 bias values received from the routing block 331, the mux 430 may include a set of two sub-muxes 364 for each tap included in the DFE 70. Further, in some embodiments, each of the set of sub-muxes 364 may receive a number of bias levels generated by the multi-level mirrored-voltage bias generator 400 and routed through the routing block 331 as inputs. For example, the mux 430 may include a first set of sub-mux 337 and sub-mux 432 that may select the NBias 202 value and the PBias 404 output bias levels, respectively. The set of sub-muxes 364 may further include an input select signal, which may be received from a select signal 336 corresponding to the same tap as the set of sub-muxes 364. In some embodiments, each sub-mux 364 in the set of sub-muxes 364 may receive the same select signal 336 as an input. For example, sub-mux 337 and sub-mux 432 may receive the same select signal 336. As such, each set of sub-muxes 364 may select and output a set of suitable mirrored-voltage bias levels for a corresponding tap, according to the globally available mirrored-voltage bias levels generated by the multi-level mirrored-voltage bias generator 400 and the select signal 336 decoded from the DFE-MR signal 333.

Because the contribution of each tap in the DFE 70 may depend on the distortion caused by the previously received data and, as discussed, because the most recent previously received data (e.g., bit n−1) may have a stronger contribution to the distortion of the received data (e.g., distorted bit n) than bits received at earlier times (e.g., bits n−1. n−2, and n−3), a suitable bias level range for the first tap may be wider than the range for a later tap, such as the fourth tap. That is, greater correction may be applied, using a higher bias level, to the first tap than a later tap. As such, the first set of sub-muxes (e.g., 337 and 432) may receive the entire range of bias levels generated by the DFE bias generator, excluding the additional bias values (e.g., DQ reference signal 83, VNBiasVGA, and VNBiasSUM). That is, in the illustrated embodiment, the first sub-mux 337 may receive NBias<40:0> (e.g., 41 inputs) as an input, and the sub-mux 432 may receive PBias<40:0> (e.g., 41 inputs) as an input. In such embodiments, to select between the inputs, the select signal 336 corresponding to the first tap (e.g., T1<5:0>) may include a suitable number of bits (e.g., 6) to so that a unique coding may be mapped to and/or used for selecting an output bias level from the input bias levels. That is, a select signal 336 with 6 bits, for example, may encode 64 different values, and as such, the first sub-mux 337 may have a different 6-bit coding for each of the 41 inputs (e.g., NBias<40:0>), and the sub-mux 432 may have an identical coding for each of the 41 inputs mirroring those of the first sub-mux 337 (e.g., PBias<40:0>). As such, in the illustrated embodiment, a different select signal 336 may correspond to an input and a mirrored input. In contrast, the second sub-mux 338 and sub-mux 346B' may receive fewer inputs (e.g., NBias<15:0> and PBias<15:0>, respectively), as the suitable bias level range for the second tap may be narrower than that of the first tap. That is, the DFE 70 may apply less correction to the second tap than the first tap, as bit n−2 may apply less distortion to the received data than the most recent previously received data (e.g., bit n−1). Accordingly, in some embodiments, the third sub-mux 339 and the sub-mux 434 may receive even fewer inputs (e.g., NBias<12:0>), and the fourth sub-mux 340 and the sub-mux 435 may receive the fewest inputs (e.g., NBias<8:0>). In such embodiments, the sub-muxes receiving fewer inputs than the first sub-mux 337 (e.g., the second sub-mux 338, the third sub-mux 339, and the fourth sub-mux 340) may receive a smaller select signal 336, as fewer bits may identify the reduced number of input options. In the illustrated embodiment, for example, a 4-bit select signal 336 (e.g., T2<3:0>) is used to select an output from the 16 options (e.g., NBias<15:0>) available to the second sub-mux 338.

Accordingly, in the illustrated embodiment, each of the sub-muxes 364 are labeled to denote the number of inputs the sub-mux 364 is equipped to receive and the number of outputs the sub-mux 364 is equipped to select. For example, the first sub-mux 337 may receive 41 inputs (e.g., NBias<40:0>) and may select a single output (e.g., NBiasT1). As such, in the illustrated embodiment, the first sub-mux 337 is labeled 41:1 to reflect the 41 inputs and single output.

Thus, each of the sub-muxes 364 (e.g., 337, 338, 339, and 340) may receive a number bias levels as inputs (e.g., NBias<40:0>, NBias<15:0>, NBias<12:0>, and NBias<8:0>, respectively) and may select an output bias level (e.g., NBiasT1, NBiasT2, NBiasT3, and NBiasT4, respectively) based on a suitably sized select signal 336 (e.g., T1<5:0>, T2<3:0>, T3<3:0>, and T4<3:0>, respectively). To that end, the mux 356 may output each of the output bias levels (e.g., NBiasT1, NBiasT2, NBiasT3, and NBiasT4) generated by the sub-muxes 364 (e.g., 337, 338, 339, and 340 respectively) to a DQ connector 50, as illustrated in FIG. 19. The mux 356 may further output the additional bias levels (e.g., VNBiasVGA, VNBiasSUM, and DQ reference signal 83) so that, in the illustrated embodiment, the DQ connector 50 may receive 7 input signals (e.g., an input bias level for each of 4 taps in the DFE 70 and the set of three bias levels).

In some embodiments, the mux 356 may operate in the voltage domain. As such, the bias levels generated by the DFE bias generator 200 and input into the mux 356 (e.g., NBias<40:0>) may represent voltages. Further, the selected bias levels output by the mux 356 (e.g., NBiasT1, NBiasT2, NBiasT3, NBiasT4) may represent voltages. As such, in such embodiments, the mux 356 and/or other portions of the routing scheme of FIG. 19 may include decoupling capacitance to reduce noise in the bias levels as they are generated, routed, and selected. Further, the decoupling capacitance may result in a low current load on the routing scheme, as the NBias 202 levels may not draw current. Working in the voltage domain may further allow the mux 356 to function on a high impedance node. As such, the mux 356 may switch (e.g., select) an output bias level with little charging and/or discharging time. Thus, the mux 356 may have little time penalty (e.g., delay) to switch between bias levels.

Figure 21:
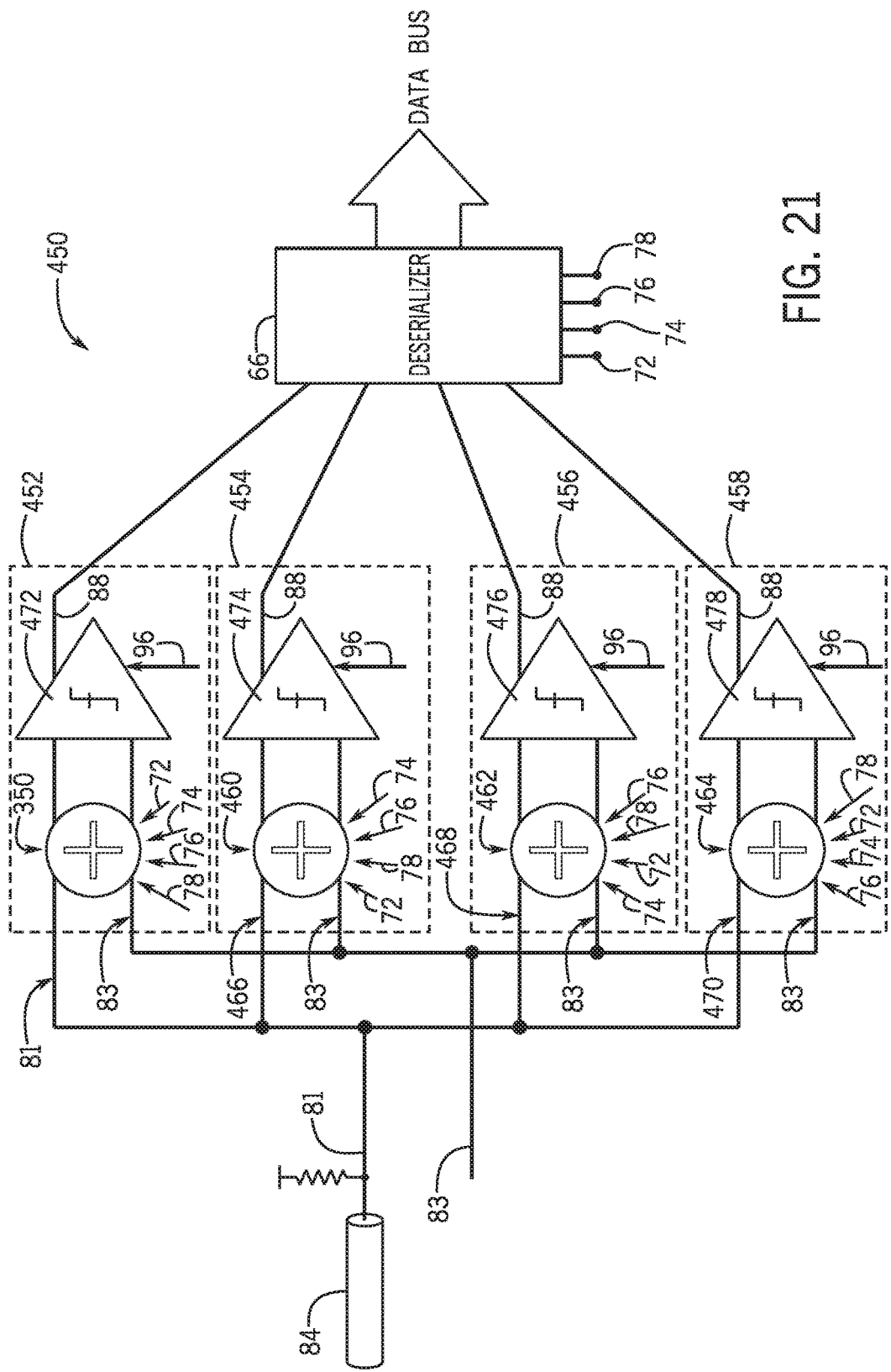
FIG. 21 illustrates a third embodiment of a distortion correction circuit, according to an embodiment of the present disclosure.

Turning now to FIG. 21, an example of a circuit that may increase the processing speed of distortion correction is illustrated. The distortion correction circuit 450 which may be capable of processing four data bits at a four bit distortion correction level, and includes four distortion correction circuits 452, 454, 456, and 458 which are similar to the distortion correction circuit 160 described in FIG. 7 with modification to the inputs between the duplications, but no amplifying device 82 (although a similar circuit could instead include the amplifying device 82). Furthermore, the summers 85, 460, 462, and 464 may operate as described in FIG. 15. The four distortion circuits 452, 454, 456, and 458 are referred to as a first circuit 452, a second circuit 454, a third circuit 456, and a fourth circuit 458. The method of rolling the distorted bit 81 received may be followed. As such, the distorted bit 81 may be received by the first circuit 452, the second distorted bit 466 may be received by the second circuit 454, the third distorted bit 468 may be received by the third circuit 456, a fourth distorted bit 470 may be received by the fourth circuit 458, and a fifth distorted bit may be rolled back to be received by the first circuit once the first iteration of the distortion correction is complete.

In some embodiments, a first bit stream may be transmitted to the channel 84 at t=0. Enough time may not have passed between the transmission of an n−1 bit prior in time to the distorted bit 81 (e.g., the "n bit") to allow for calculation of the distortion contribution of the n−1 bit to the distorted bit 81. If this occurs, one solution may be to wait for the n−1 bit information to complete transmitting to the deserializer 66 so it may be used in the distortion calculation. However, another technique may alternatively be applied.

At a time t=1 (after time t=0), the distorted bit 81 may have been received by the channel 84 and DFE calculations thereon may have begun while a second distorted bit n+1 is received by the channel 84, such that enough time may have passed to allow for the n−1 bit to be known to the deserializer 66 (e.g., stored therein), but the n−1 corrected bit may not yet have been applied to aid in the correction determination of the value of the distorted bit 81. At a third time t=2 (after time t=1), a third distorted bit n+2 may be received at the channel 84, however, not enough time may have passed for the distorted bit 81 to become the corrected bit 88 and to be received in the deserializer 66 as information to correct the distortion of the second distorted bit 280. Thus, as with the distorted bit 81 received at t=0, the distortion calculation must wait until the corrected bit 88 is received in the deserializer 66 and transmitted for distortion correction of the second distorted bit n+1. There may exist a more time efficient solution than waiting for correction of the distorted bits 81, n+1, and n+2, etc. without performing any additional processes during the waiting time.

Indeed, it may be desired to compensate for limited transmission bandwidth at the DQ receiver 62. The solution may lie in adding duplicates of the equalizers to allow for rapid computing of distortion correction values. In some embodiments, to increase bandwidth at the DQ receiver 62, duplicate equalizers (e.g., at least two of the DFE 70 utilizing the push-pull summer 350 in place of summer circuit 85) may be utilized. One embodiment implementing duplicate equalizers is illustrated in FIG. 21, with distortion correction circuit 450 utilizing DFE 452, DFE 454, DFE 456, and DFE 458 (e.g., as equalizers that may allow for rapid computing of distortion correction values that each operate with the push-pull summer 350 in place of summer circuit 85 of FIG. 7). While duplication of four equalizers are illustrated to compensate for transmission bandwidth limitations, it should be appreciated that two, three, five or more equalizers may be implemented in a manner similar to that described herein with respect to the four equalizers illustrated in FIG. 21.

As illustrated, the distortion correction circuit 450 may be capable of processing four data bits each at a four bit distortion correction level via the DFE 452, DFE 454, DFE 456, and DFE 458, which are similar to the DFE 70 described in FIG. 7 with the push-pull summer 350, 460, 462, and 464 used respectively in place of summer circuit 85, as described above with respect to FIG. 15. In this manner, the summer circuits 350, 460, 462, and 464 of FIG. 17 may operate in the manner described above with respect to the push-pull summation circuit of FIG. 15.

To compensate for limited transmission bandwidth, a method of rolling distorted bits of a received bit stream between the DFE 452, DFE 454, DFE 456, and DFE 458 may be followed as a method of alleviating a backup of distorted bits resulting from limited transmission bandwidth. In this way, as the distorted bit 81 of a received bit stream is being processed in the DFE 452 in a first iteration of distortion correction, a second distorted bit 466 may be received in the DFE 454 to start a second iteration of distortion correction. This allows the second iteration of distortion correction to occur while the first iteration of distortion correction is completing. Likewise, as the second distorted bit 466 of the received bit stream is being processed in the DFE 454 in a second iteration of distortion correction (which may coincide with the first distorted bit 81 being processed in the DFE 452 in a first iteration of distortion correction), a third distorted bit 468 may be received in the DFE 456 to start a third iteration of distortion correction. Similarly, as the third distorted bit 468 of the received bit stream is being processed in the DFE 456 in a third iteration of distortion correction (which may coincide with the second distorted bit 466 being processed in the DFE 454 in a second iteration of distortion correction or may coincide with the second distorted bit 466 being processed in the DFE 454 in a second iteration of distortion correction and the distorted bit 81 being processed in the DFE 452 in a first iteration of distortion correction), a fourth distorted bit 470 may be received in the DFE 458 to start a fourth iteration of distortion correction.

In some embodiments, the first iteration of distortion correction may be completed before a fifth distorted bit is received via the channel 84, which allows the fifth distorted bit to be rolled back to the DFE 452 for a fifth of distortion correction. Likewise, the second iteration of distortion correction may be completed before a sixth distorted bit is received via the channel 84, which allows the sixth distorted bit to be rolled back to the DFE 454 for a sixth distortion correction, and so forth. In this manner, the DFE 452, DFE 454, DFE 456, and DFE 458 may be utilized in conjunction with a rolling DFE correction technique. That is, the distorted bit 81 of a bit stream received from channel 84 may be received by the DFE 452, a second distorted bit 466 of the bit stream may be received by the DFE 454, a third distorted bit 468 of the bit stream may be received by the DFE 456, a fourth distorted bit 470 of the bit stream may be received by the DFE 458, and a fifth distorted bit may be rolled back to be received by the DFE 452 once the first iteration of the distortion correction is complete.

To elaborate further, the DFE 452 may receive the distorted bit 81 and the voltage correction signal 83 (for example, without having been or having been amplified by amplifier 82) and may process the distorted bit 81 using the method described above with respect to the distortion correction circuit 160 of FIG. 7 having the push-pull summer 350, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 350. It may be important to note that the previous bits may be stored for transmission along the paths 72, 74, 76, and 78 in any order as long as during the distortion correction, the proper previous bit order is observed (e.g., n−1 bit as the most significant bit and the n−4 bit as the least significant bit). Once generated, the corrected bit 88 of the data latch 472 may be transmitted on the rising edge of the DQS signal 96 to the deserializer 66 to update, for example, the n−1 bit location of the deserializer 66.

Additionally, as illustrated, the inputs used for the final decision of the corrected bit 88 for the DFE 454 may be different from the inputs for the DFE 452. DFE 454 may receive a second distorted bit 466 and may processing it after the distorted bit 81 is received (e.g., while distorted bit 81 is having its distortion corrected in the DFE 452). The method described above with respect to the distortion correction circuit 160 having the push-pull summer 350, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 350 may be used in processing of the second distorted bit 466. However, as illustrated, the previous bit or weighted tap data transmitted along the paths 72, 74, 76, and 78 may be shifted with respect to the inputs to the DFE 452 to take into account that the distorted bit 81 corrected into corrected bit 88 by the DFE 452 becomes the n−1 bit value for the DFE 454. Once generated, the corrected bit 88 of the data latch 474 may be transmitted on the rising edge of the DQS signal 96 to the deserializer 66 to update, for example, the n−1 bit location of the deserializer 66 (e.g., moving the corrected bit 88 from the DFE 452 to the n−2 bit location).

Likewise, the inputs used for the final decision of the corrected bit 88 for the DFE 456 may be different from the inputs for the DFE 452 and DFE 454. DFE 456 may receive a third distorted bit 468 and may processing it after the distorted bits 81 and 466 are received (e.g., while distorted bits 81 and 466 are having their distortion corrected in the DFE 452 and DFE 454, respectively). The method described above with respect to the distortion correction circuit 160 having the push-pull summer 350, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 350 may be used in processing of the third distorted bit 468. However, as illustrated, the previous bit or weighted tap data transmitted along the paths 72, 74, 76, and 78 may be shifted with respect to the inputs to the DFE 452 and the DFE 454 to take into account that the distorted bits 81 and 466 corrected into respective corrected bits 88 by the DFE 452 and DFE 454 become the n−2 bit value and the n−1 bit value for the DFE 456. Once generated, the corrected bit 88 of the data latch 476 may be transmitted on the rising edge of the DQS signal 96 to the deserializer 66 to update, for example, the n−1 bit location of the deserializer 66 (e.g., moving the corrected bit 88 from the DFE 452 to the n−3 bit location and moving the corrected bit 88 from the DFE 454 to the n−2 bit location).

Similarly, the inputs used for the final decision of the corrected bit 88 for the DFE 238 may be different from the inputs for the DFE 232, the DFE 234, and the DFE 236. DFE 238 may receive a fourth distorted bit 250 and may processing it after the distorted bits 81, 246, and 248 are received (e.g., while distorted bits 81, 246, and 248 are having their distortion corrected in the DFE 452, 454, and 456, respectively). The method described above with respect to the distortion correction circuit 160 having the push-pull summer 350, using the previous bit or weighted tap data transmitted along the paths 72, 74, 76, and 78 (e.g., from the n−1 bit, n−2 bit, the n−3 bit, and the n−4 bit inputs) to calculate the values applied via the push-pull summer 350 may be used in processing of the fourth distorted bit 470. However, as illustrated, the previous bit or weighted tap data transmitted along the paths 72, 74, 76, and 78 may be shifted with respect to the inputs to the DFE 452, 454, and 456 to take into account that the distorted bits 81, 466, and 468 corrected into respective corrected bits 88 by the DFE 452, 454, and 456 become the n−3 bit value, the n−2 bit value, and the n−1 bit value for the DFE 458. Once generated, the corrected bit 88 of the data latch 478 may be transmitted on the rising edge of the DQS signal 96 to the deserializer 66 to update, for example, the n−1 bit location of the deserializer 66 (e.g., moving the corrected bit 88 from the DFE 452 to the n−4 bit location and moving the corrected bit 88 from the DFE 454 to the n−3 bit location, and moving the corrected bit 88 from the DFE 456 to the n−2 bit location).

The outputs 88 from the data latches 472, 474, 476, and 478 from the DFE 452, 454, 456, and 458 may be sent to the deserializer 66 at the conclusion of each final decision on the corrected bit 88. As noted above, in the deserializer 66, the n−1 bit, the n−2 bit, the n−3 bit, and the n−4 bit may be used to update the data stored in the deserializer 66 for transmission along the paths 72-78 in accordance with the corrected bit 88 data (e.g., the corrected bit 88 from the each of the DFE 452, 454, 456, and 458 shifted as a new corrected bit 88 is received). It may be noted that this rolling method of DFE correction may allow for greater throughput of the bit stream received while still allowing for distortion correction of the received bits of the bit stream. While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
   a voltage generator, wherein the voltage generator is configured to generate a reference signal;
   a multi-level bias generator coupled to the voltage generator, wherein the multi-level bias generator comprises:
   a first input, wherein the first input is configured to receive the reference signal; and
   a plurality of outputs, wherein each output of the plurality of outputs is configured to transmit a respective bias level signal of a plurality of bias level signals generated by the multi-level bias generator, wherein the multi-level bias generator is configured to generate the plurality of bias level signals based at least in part on the reference signal;
   a plurality of multiplexers, wherein each multiplexer of the plurality of multiplexers comprises a second input configured to receive a select signal, wherein each multiplexer of the plurality of multiplexers is configured to receive the plurality of bias level signals and select a subset of bias level signals of the plurality of bias level signals based at least in part on the select signal, wherein each multiplexer of the plurality of multiplexers comprises a decoder, wherein each decoder is configured to generate a second select signal based at least in part on the select signal, wherein each multiplexer of the plurality of multiplexers is configured to select a second subset of bias level signals of the plurality of bias level signals based at least in part on the second select signal; and
   an adjustment circuit of a decision feedback equalizer configured to receive a respective selected subset of bias level signals from one multiplexer of the plurality of multiplexers and utilize the respective selected subset of bias level signals to compensate for inter-symbol interference of a bit due to a previously received bit of a bit stream.

2. The device of claim 1, wherein the voltage generator comprises:
   a third input, wherein the third input is configured to receive a second select signal; and
   a voltage generator output, wherein the voltage generator output is configured to transmit the reference signal, wherein the voltage generator is configured to generate the reference signal based at least in part on the second select signal.

3. The device of claim 2, comprising a register, wherein the register is operatively coupled to the third input, wherein the register is configured to store an indication of the second select signal as a programmable value.

4. The device of claim 1, wherein the voltage generator is configured to generate a first modified reference signal comprising a modified version of the reference signal and transmit the modified reference signal to a second input of the multi-level bias generator.

5. The device of claim 1, wherein the voltage generator is configured to generate:
   a first modified reference signal comprising a modified version of the reference signal; and
   a second modified reference signal comprising a second modified version of the reference signal.

6. The device of claim 5, wherein the first modified version of the reference signal comprises a first correction factor related to a desired level of correction of the reference signal and the second modified version of the reference signal comprises a second correction factor related to a second desired level of correction of the reference signal.

7. The device of claim 6, wherein the first correction factor comprises a minimum difference between the reference signal and the first modified reference signal detectable by the multi-level generator, wherein the multi-level generator comprises a third input configured to receive the first modified reference signal.

8. The device of claim 7, wherein the second correction factor comprises a maximum difference between the reference signal and the second modified reference signal detectable by the multi-level generator, wherein the multi-level generator comprises a fourth input configured to receive the second modified reference signal.

9. The device of claim 1, wherein the multi-level bias generator is configured to generate the plurality of bias level signals at a runtime of a memory device coupled to the decision feedback equalizer.

10. The device of claim 1, comprising a register wherein the register is operatively coupled to the second input and the register is configured to store the select signal, wherein the select signal comprises a programmable value.

11. The device of claim 1, wherein the multi-level bias generator is configured to adjust the plurality of bias level signals in response to a change in operating conditions affecting the decision feedback equalizer.

12. The device of claim 11, wherein the operating conditions comprise process, voltage, or temperature changes affecting operation of the decision feedback equalizer.

13. A method, comprising:
generating a reference signal based at least in part on a programmable signal;
generating a plurality of bias level signals based at least in part on the reference signal, wherein the plurality of bias level signals comprises a first bias level having a first absolute value, wherein the plurality of bias level signals comprises a second bias level having the first absolute value;
routing the plurality of bias level signals to a multiplexer;
selecting, using the multiplexer, a subset of the plurality of bias levels to output to an adjustment circuit of a decision feedback equalizer configured to receive the subset to compensate for inter-symbol interference of a bit due to a previously received bit of a bit stream.

14. The method of claim 13, comprising combining the reference signal with a correction factor related to a level of distortion removal to generate a modified reference signal.

15. The method of claim 14, comprising generating the plurality of bias level signals based at least in part on the modified reference signal in conjunction with the reference signal.

16. The method of claim 13, wherein selecting the subset of the plurality of bias levels based at least in part on a select signal received by the multiplexer.

17. A device, comprising:
a selection circuit configured to generate a plurality of bias levels based at least in part on a received reference signal, wherein the selection circuit comprises a receiver, an amplifier, and a feedback loop configured to couple an output of the amplifier to an input of the receiver to adjust the plurality of bias levels in response to a change in operating conditions affecting a decision feedback equalizer comprising the combinational circuit and the latching element;
routing circuitry coupled to the selection circuit and configured to receive the plurality of bias levels from the selection circuit;
a multiplexer coupled to the routing circuity and configured to receive the plurality of bias levels from the routing circuitry, wherein the multiplexer is configured to select a bias level of the plurality of bias levels based at least in part on a programmable value received at a first input of the multiplexer;
a combinational circuit coupled to the multiplexer and configured to receive the bias level from the multiplexer, wherein the combinational circuit is configured to generate a distortion correction factor based on the bias level to generate a correction signal to offset inter-symbol interference from a data stream on a received distorted bit; and
a latching element coupled to the combinational circuit and configured to receive the correction signal and latch a corrected bit value corresponding to a determined value of the received distorted bit.

* * * * *